US012575413B2

(12) United States Patent
Cho et al.

(10) Patent No.: US 12,575,413 B2
(45) Date of Patent: Mar. 10, 2026

(54) SEMICONDUCTOR PACKAGE

(71) Applicant: SAMSUNG ELECTRONICS CO., LTD., Suwon-si (KR)

(72) Inventors: Eunho Cho, Asan-si (KR); Jihwang Kim, Cheonan-si (KR); Jongbo Shim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 556 days.

(21) Appl. No.: 17/826,505

(22) Filed: May 27, 2022

(65) Prior Publication Data

US 2023/0112061 A1    Apr. 13, 2023

(30) Foreign Application Priority Data

Oct. 13, 2021    (KR) ........................ 10-2021-0136158

(51) Int. Cl.
*H01L 23/473*      (2006.01)
*H01L 23/00*       (2006.01)
*H01L 25/065*      (2023.01)

(52) U.S. Cl.
CPC ............ *H01L 23/473* (2013.01); *H01L 24/16* (2013.01); *H01L 24/32* (2013.01); *H01L 24/73* (2013.01);
(Continued)

(58) Field of Classification Search
CPC ......... H01L 23/473; H01L 2224/32145; H01L 25/0657
See application file for complete search history.

(56) References Cited

U.S. PATENT DOCUMENTS 4,953,060 A   *   8/1990   Lauffer ................. H05K 7/023
                                                                257/713
8,159,065 B2      4/2012   Suh et al.
                    (Continued)

FOREIGN PATENT DOCUMENTS

JP      2020-107909 A    7/2020
KR      10-1038313       5/2011
KR      10-1046252       6/2011

OTHER PUBLICATIONS

Office Action dated Jul. 15, 2025 issued in corresponding Korean Patent Application No. 10-2021-0136158. (Note: US 2010-0187683 A1, US 2021-0013126 A1, and US 2006-0125092 A1 previously cited.).

*Primary Examiner* — Eric K Ashbahian
(74) *Attorney, Agent, or Firm* — Morgan, Lewis & Bockius LLP

(57)    ABSTRACT

A semiconductor package includes a first semiconductor chip, a second semiconductor chip disposed on the first semiconductor chip, a chip connection terminal configured to electrically connect the first semiconductor chip to the second semiconductor chip, an underfill layer disposed between the first semiconductor chip and the second semiconductor chip and surrounding the chip connection terminal, a vertical porous structure filling spaces of a plurality of vertical cooling channels passing through the first semiconductor chip, the second semiconductor chip, and the underfill layer in a vertical direction, and having a plurality of cooling holes, and a cooling fluid provided to the plurality of cooling holes of the vertical porous structure to flow inside the plurality of vertical cooling channels.

19 Claims, 21 Drawing Sheets

(52) U.S. Cl.
CPC .................... *H01L 25/0657* (2013.01); *H01L 2224/16148* (2013.01); *H01L 2224/16227* (2013.01); *H01L 2224/16238* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06524* (2013.01); *H01L 2225/06544* (2013.01); *H01L 2225/06589* (2013.01); *H01L 2924/1431* (2013.01); *H01L 2924/1434* (2013.01)

(56) References Cited

U.S. PATENT DOCUMENTS

| | | | |
|---|---|---|---|
| 9,024,434 B2 | 5/2015 | Im et al. | |
| 9,111,899 B2 | 8/2015 | Bartley et al. | |
| 9,472,483 B2 | 10/2016 | Gambino et al. | |
| 9,960,150 B2 | 5/2018 | Bitz et al. | |
| 2005/0083655 A1* | 4/2005 | Jairazbhoy .......... | H01L 23/3733 |
| | | | 257/E23.098 |
| 2006/0125092 A1* | 6/2006 | Marshall ............. | H01L 25/0657 |
| | | | 257/723 |
| 2010/0187683 A1* | 7/2010 | Bakir ................ | H01L 23/53276 |
| | | | 257/713 |
| 2020/0402888 A1* | 12/2020 | Tsutsui .................... | H01L 23/32 |
| 2021/0013126 A1* | 1/2021 | Joshi ........................ | H01L 24/83 |
| 2021/0381101 A1* | 12/2021 | Nanjundappa ...... | H01L 21/6719 |
| 2024/0414894 A1* | 12/2024 | Müller .............. | H05K 7/20936 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2021-0136158, filed on Oct. 13, 2021 in the Korean Intellectual Property Office, the disclosure of which is incorporated by reference herein in its entirety.

TECHNICAL FIELD

Embodiments of the inventive concept relate to a semiconductor package.

DISCUSSION OF RELATED ART

As the storage capacity of a semiconductor chip increases, a semiconductor package including the semiconductor chip having a reduced thickness and weight is desired. In addition, research for providing semiconductor chips of various functions to the inside of a semiconductor package and quickly driving the semiconductor chips has been conducted. In addition, to improve the operating performance of a plurality of semiconductor chips included in a semiconductor package, research for increasing the heat-dissipating performance of the semiconductor package has been conducted.

SUMMARY

Embodiments of the inventive concept provide a semiconductor package having increased heat-dissipating performance.

According to an example embodiment of the inventive concept, provided is a semiconductor package including: a first semiconductor chip including a first semiconductor substrate having a first active layer, a first chip through electrode connected to the first active layer by passing through the first semiconductor substrate in a vertical direction, and a first upper chip pad on the first semiconductor substrate and connected to the first chip through electrode; a second semiconductor chip on the first semiconductor chip, including a second semiconductor substrate having a second active layer, and a second lower chip pad disposed below the second semiconductor substrate and connected to the second active layer; a chip connection terminal disposed between the first upper chip pad and the second lower chip pad; a first underfill layer disposed between the first semiconductor chip and the second semiconductor chip to surround the chip connection terminal; a vertical porous structure filling spaces of a plurality of vertical cooling channels passing through the first semiconductor chip, the second semiconductor chip, and the first underfill layer in the vertical direction, and having a plurality of cooling holes; and a cooling fluid provided to the plurality of cooling holes of the vertical porous structure to flow inside the plurality of vertical cooling channels.

According to an example embodiment of the inventive concept, provided is a semiconductor package including: a first semiconductor chip including a first semiconductor substrate having a first active layer, and a first chip pad disposed below the first semiconductor substrate and connected to the first active layer; a first support layer disposed below the first semiconductor chip; a first lower conductive connection pad on the first support layer; a first chip connection terminal disposed between the first chip pad and the first lower conductive connection pad; a first underfill layer disposed between the first semiconductor chip and the first support layer to surround the first chip connection terminal; a vertical porous structure filling spaces of a plurality of vertical cooling channels passing through the first semiconductor chip, the first underfill layer, and the first support layer in the vertical direction, and having a plurality of cooling holes; a first horizontal porous structure disposed below the first support layer to form a first horizontal cooling channel connected to the plurality of vertical cooling channels, and having a plurality of cooling holes; a second horizontal porous structure on the first semiconductor chip to form a second horizontal cooling channel connected to the plurality of vertical cooling channels, and having a plurality of cooling holes; a first through electrode connected to the first lower conductive connection pad by passing through the first horizontal porous structure and the first support layer in the vertical direction; a second through electrode connected to the first chip pad by passing through at least a portion of the second horizontal porous structure and the first semiconductor substrate in the vertical direction; and a cooling fluid flowing inside the plurality of vertical cooling channels, the first horizontal cooling channel, and the second horizontal cooling channel through the plurality of cooling holes of the vertical porous structure, the first horizontal porous structure, and the second horizontal porous structure.

According to an example embodiment of the inventive concept, provided is a semiconductor package including: a first semiconductor chip having a first active layer; a second semiconductor chip on the first semiconductor chip and having a second active layer; a third semiconductor chip on the second semiconductor chip and having a third active layer; a lowermost porous structure disposed below the first semiconductor chip and having a plurality of cooling holes forming a lowermost cooling channel; a first horizontal porous structure disposed between the first semiconductor chip and the second semiconductor chip and having a plurality of cooling holes forming a first horizontal cooling channel; a second horizontal porous structure disposed between the second semiconductor chip and the third semiconductor chip and having a plurality of cooling holes forming a second horizontal cooling channel; an uppermost porous structure on the third semiconductor chip and having a plurality of cooling holes forming an uppermost cooling channel; a vertical porous structure having a plurality of cooling holes forming a plurality of vertical cooling channels connecting the lowermost cooling channel, the first horizontal cooling channel, and the uppermost cooling channel by passing through the first semiconductor chip, the second semiconductor chip, and the third semiconductor chip in a vertical direction; and a cooling fluid flowing inside the lowermost cooling channel, the first horizontal cooling channel, the second horizontal cooling channel, and the plurality of vertical cooling channels.

BRIEF DESCRIPTION OF THE DRAWINGS

The above and other features of the inventive concept will become more apparent by describing in detail example embodiments thereof with reference to the accompanying drawings, in which.

3

Figure 2:
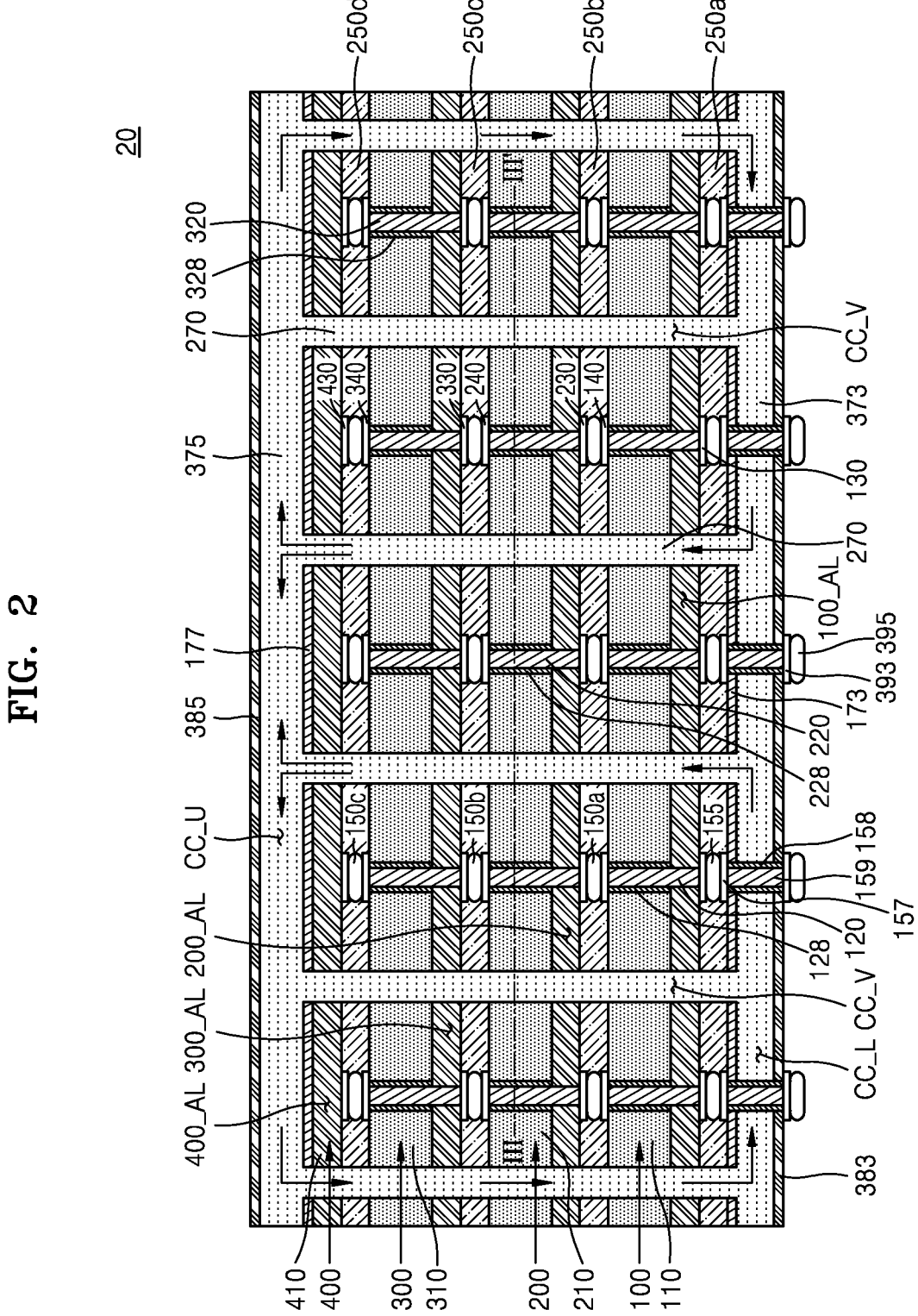
Figure 3:
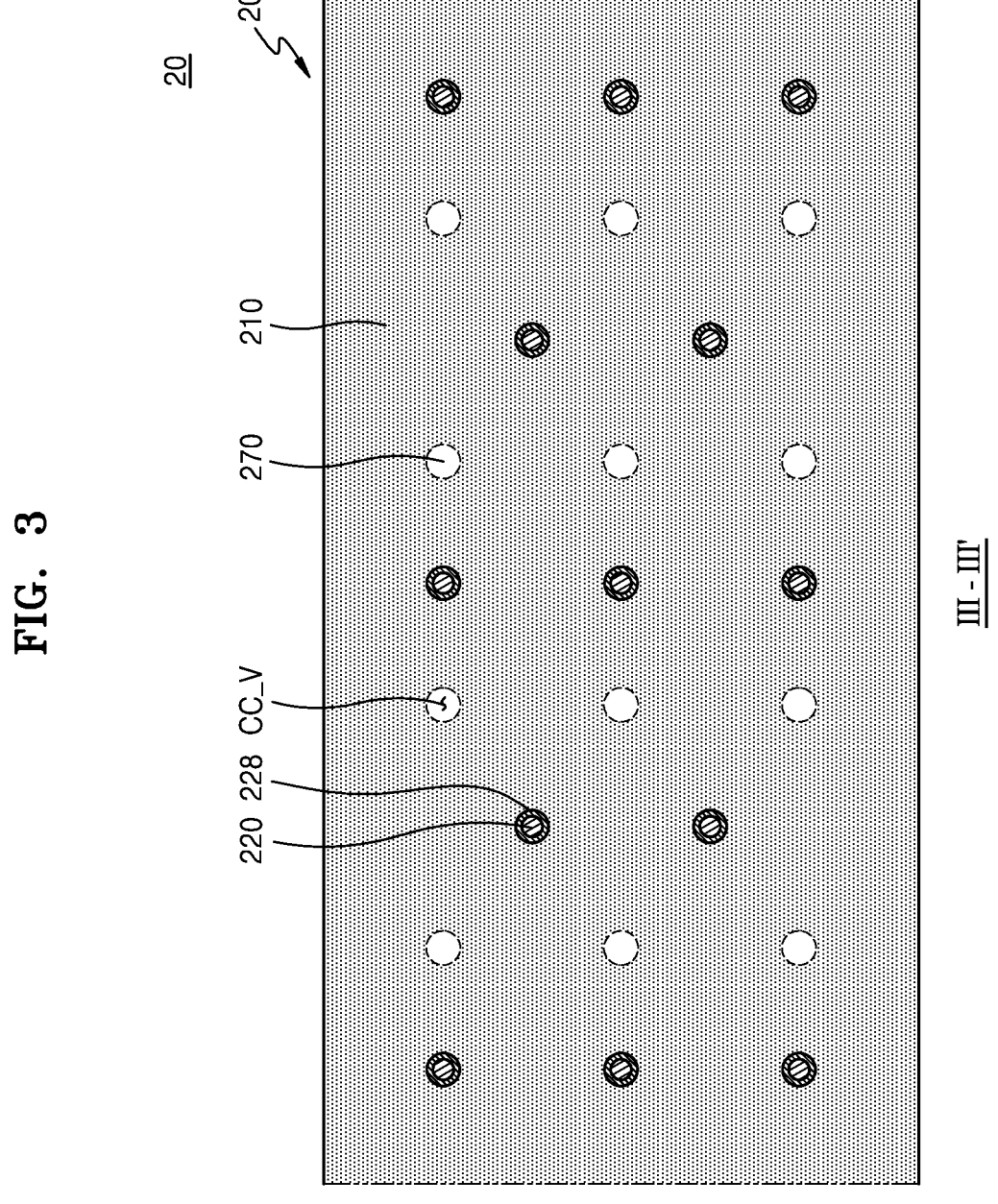
Figure 4:
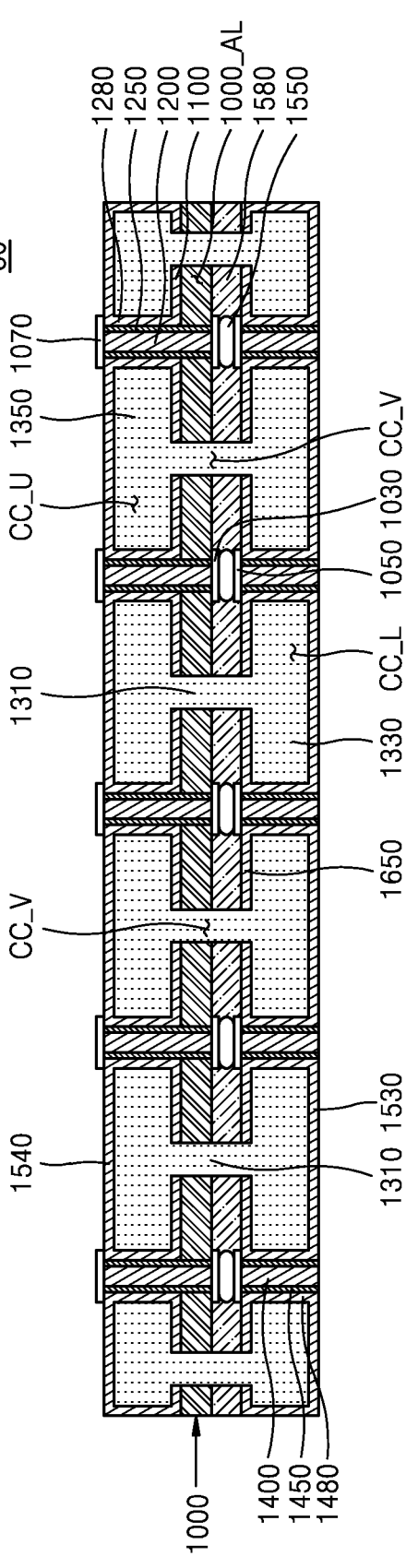
Figure 6:
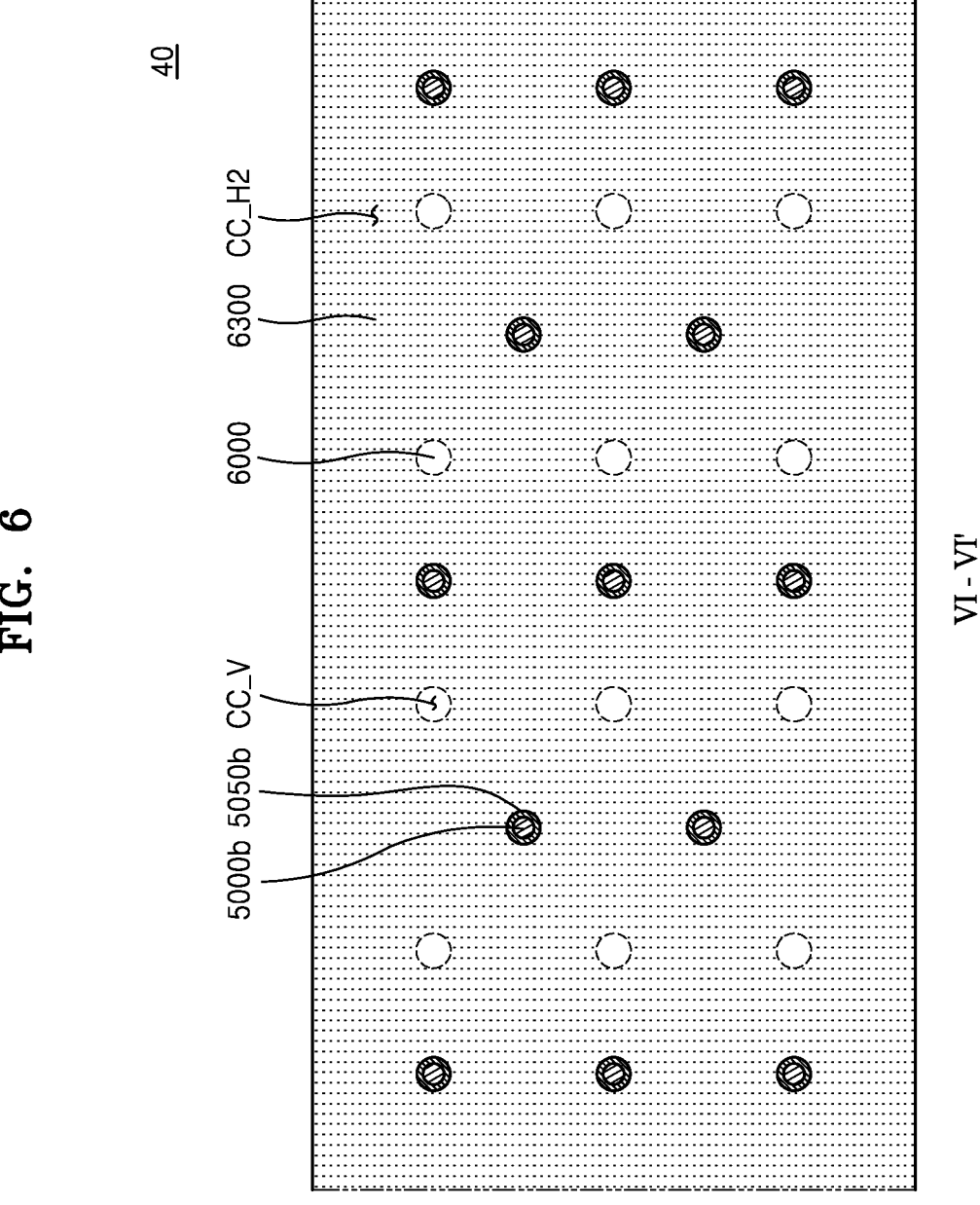

FIG. 2 is a cross-sectional view of a semiconductor package according to an example embodiment of the inventive concept;

FIG. 3 is a cross-sectional view taken along line III-III' of FIG. 2 according to an example embodiment of the inventive concept;

FIG. 4 is a cross-sectional view of a semiconductor package according to an example embodiment of the inventive concept;

Figure 5:
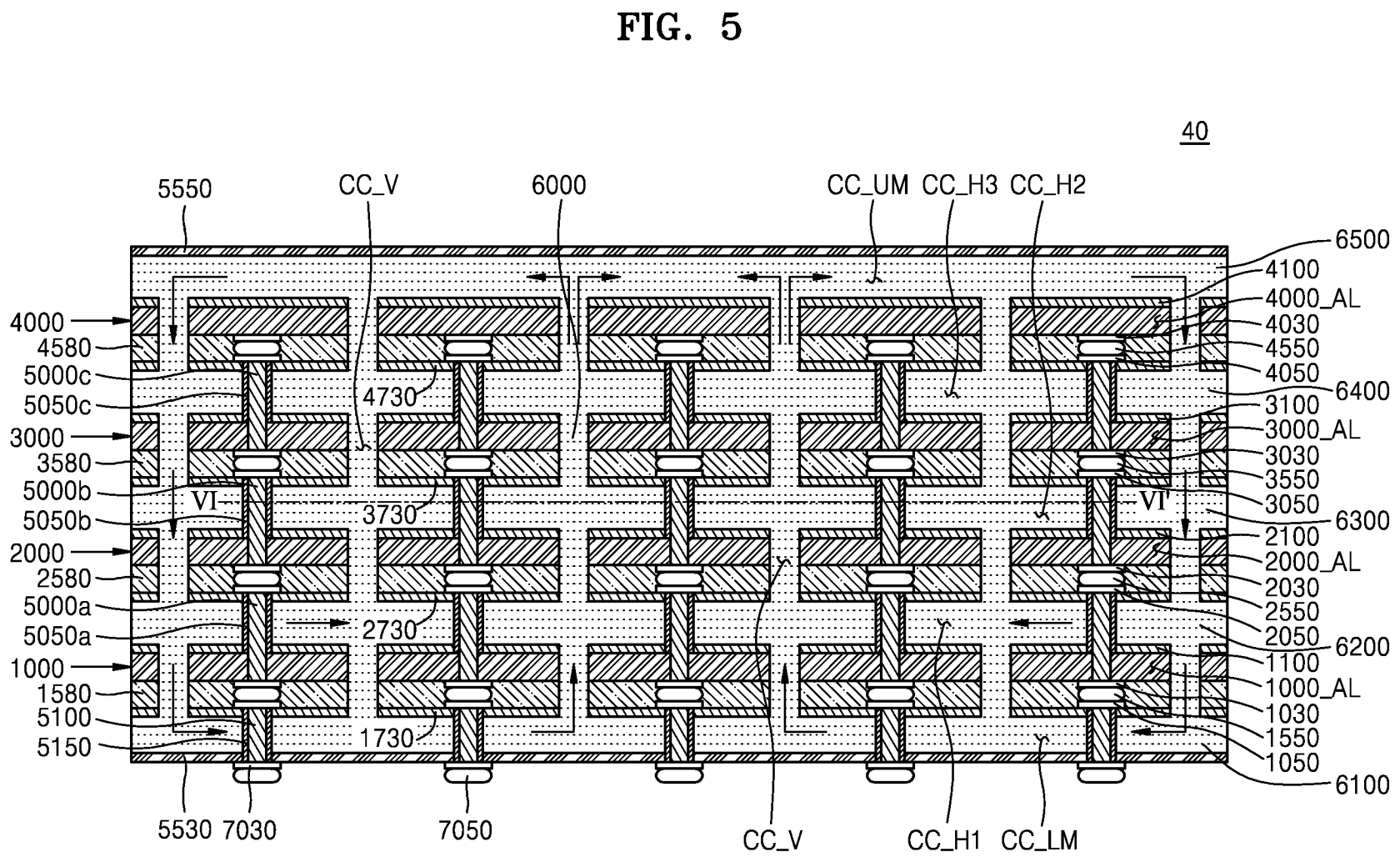

FIG. 5 is a cross-sectional view of a semiconductor package according to an example embodiment of the inventive concept;

FIG. 6 is a cross-sectional view taken along line VI-VI' of FIG. 5;

FIG. 7 is a cross-sectional view of a semiconductor package according to an example embodiment of the inventive concept; and FIGS. 8 to 21 are cross-sectional views illustrating operations of a method of manufacturing a semiconductor package, according to an example embodiment of the inventive concept.

DETAILED DESCRIPTION OF THE EMBODIMENTS

Example embodiments of the inventive concept will be described more fully hereinafter with reference to the accompanying drawings Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Figure 1:
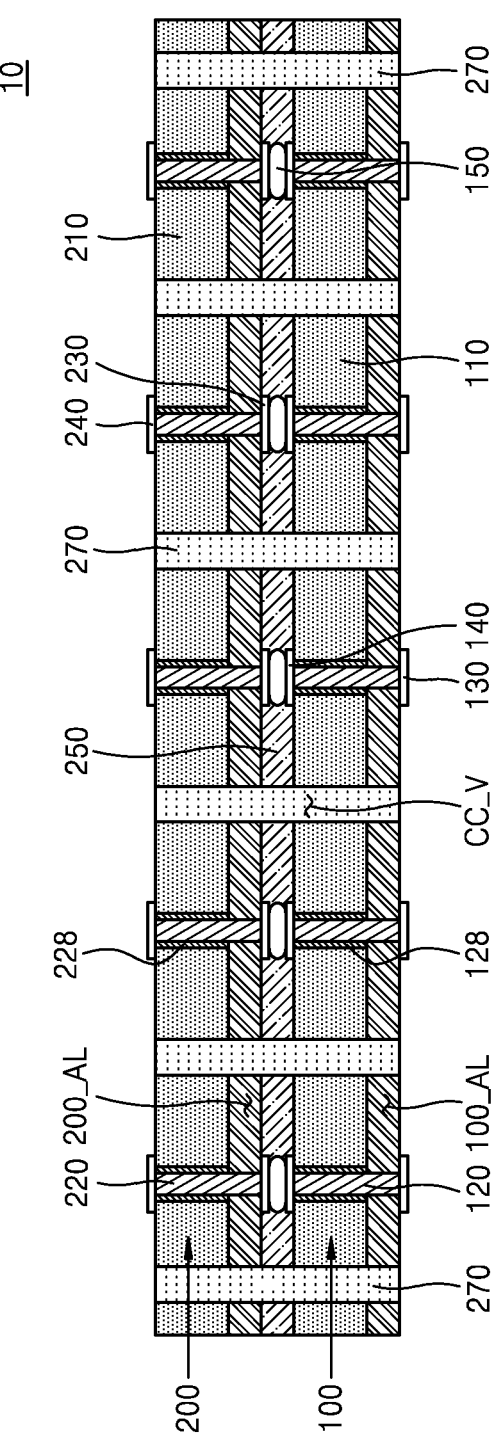
FIG. 1 is a cross-sectional view of a semiconductor package according to an example embodiment of the inventive concept.

FIG. 1 is a cross-sectional view of a semiconductor package 10 according to an example embodiment of the inventive concept.

Referring to FIG. 1, the semiconductor package 10 according to an example embodiment of the inventive concept may include a first semiconductor chip 100, a second semiconductor chip 200, a chip connection terminal 150, an underfill layer 250, a vertical porous structure 270, and a cooling fluid.

The first semiconductor chip 100 may include a first semiconductor substrate 110 having a first active layer 100_AL, a first chip through electrode 120, a first lower chip pad 130, and a first upper chip pad 140.

In an example embodiment, the first semiconductor chip 100 may include a memory semiconductor chip. For example, the memory semiconductor chip may include a volatile memory chip such as dynamic random access memory (DRAM) or static random access memory (SRAM), or a nonvolatile memory chip such as phase-change random access memory (PRAM), magneto-resistive random access memory (MRAM), ferroelectric random access memory (FeRAM), or resistive random access memory (RRAM).

However, the first semiconductor chip 100 is not limited thereto and may include a logic semiconductor chip. For example, the logic semiconductor chip may include a central processing unit (CPU), a micro processing unit (MPU), a graphics processing unit (GPU), an application processor (AP), etc.

A material of the first semiconductor substrate 110 in the first semiconductor chip 100 may include silicon (Si). Alternatively, the material of the first semiconductor substrate 110 may include a semiconductor element such as, for example, germanium (Ge) or a compound semiconductor such as silicon carbide (SiC), gallium arsenide (GaAs), Indium arsenide (InAs), or indium phosphide (InP). However, the material of the first semiconductor substrate 110 is not limited thereto.

In an example embodiment, the first semiconductor substrate 110 may include the first active layer 100_AL disposed therebelow. The first active layer 100_AL may include various types of a plurality of individual devices. For example, the plurality of individual devices may include various microelectronic devices, e.g., a complementary metal-oxide semiconductor (CMOS) transistor, a metal-oxide-semiconductor filed effect transistor (MOSFET), a system large scale integration (LSI) chip, an image sensor such as a CMOS imaging sensor (CIS), a micro-electro-mechanical system (MEMS), an active device, a passive device, etc.

The first chip through electrode 120 in the first semiconductor chip 100 may include a conductive material passing through the first semiconductor substrate 110 in a vertical direction. Hereinafter, the vertical direction may be defined as a direction that is perpendicular to a direction in which an upper surface or a lower surface of the first semiconductor substrate 110 extend, and a horizontal direction may be defined as a direction that is parallel to the direction in which the upper surface or the lower surface of the first semiconductor substrate 110 extend. The vertical direction may also be referred to as the thickness direction of the semiconductor package 10.

In an example embodiment, the first chip through electrode 120 may pass through the first semiconductor substrate 110 in the vertical direction and be electrically connected to the plurality of individual devices in the first active layer 100_AL.

In an example embodiment, the first chip through electrode 120 may include a conductive plug and a conductive barrier layer. The conductive plug may pass through the first semiconductor substrate 110, and the conductive barrier layer may surround a side wall of the conductive plug. For example, the conductive plug may have a cylindrical shape, and the conductive barrier layer may have a cylindrical shape surrounding the side wall of the conductive plug.

In an example embodiment, the first chip through electrode 120 may be electrically connected to the first lower chip pad 130 and the first upper chip pad 140 and electrically connected to the first active layer 100_AL. In addition, a first passivation layer 128 may surround at least a portion of the first chip through electrode 120. For example, a material of the first passivation layer 128 may include silicon oxynitride (SiON), silicon oxide (SiO$_2$), silicon oxycarbon nitride (SiOCN), silicon carbon nitride (SiCN), or a combination thereof.

The first lower chip pad 130 in the first semiconductor chip 100 may be disposed below the lower surface of the first semiconductor substrate 110 and electrically connected to the first chip through electrode 120. In addition, the first upper chip pad 140 in the first semiconductor chip 100 may be on the upper surface of the first semiconductor substrate 110 and electrically connected to the first chip through electrode 120.

The second semiconductor chip 200 may include a second semiconductor substrate 210 having a second active layer 200_AL, a second chip through electrode 220, a second lower chip pad 230, and a second upper chip pad 240. Hereinafter, in a description of the second semiconductor chip 200, for convenience of explanation, a description made with respect to the first semiconductor chip 100 is omitted, and differences from the first semiconductor chip 100 are mainly described.

In an example embodiment, the first semiconductor chip 100 and the second semiconductor chip 200 may be different types of semiconductor chips. Accordingly, the semiconductor package 10 may be a system in package (SIP) in which different types of a plurality of semiconductor chips, for example, the first and second semiconductor chips 100 and 200, are electrically connected to each other and operate as a single system. However, the first semiconductor chip 100 and the second semiconductor chip 200 are not limited thereto and may be the same type of semiconductor chips according to example embodiments.

In an example embodiment, the second semiconductor chip 200 may include a memory semiconductor chip. However, the second semiconductor chip 200 is not limited thereto and may include a logic semiconductor chip according to example embodiments.

The second semiconductor substrate 210 in the second semiconductor chip 200 may include the second active layer 200_AL disposed therebelow. The second active layer 200_AL may include various types of a plurality of individual devices.

The second chip through electrode 220 in the second semiconductor chip 200 may include a conductive material passing through the second semiconductor substrate 210 in the vertical direction. In an example embodiment, the second chip through electrode 220 may pass through the second semiconductor substrate 210 in the vertical direction and be electrically connected to the plurality of individual devices in the second active layer 200_AL.

In an example embodiment, the second chip through electrode 220 may include a conductive plug and a conductive barrier layer. The conductive plug may pass through the second semiconductor substrate 210, and the conductive barrier layer may surround a side wall of the conductive plug.

In an example embodiment, the second chip through electrode 220 may be electrically connected to the second lower chip pad 230 and the second upper chip pad 240. In addition, a second passivation layer 228 may surround at least a portion of the second chip through electrode 220.

The second lower chip pad 230 in the second semiconductor chip 200 may be disposed below a lower surface of the second semiconductor substrate 210 and electrically connected to the second chip through electrode 220. In addition, the second upper chip pad 240 in the second semiconductor chip 200 may be disposed on an upper surface of the second semiconductor substrate 210 and electrically connected to the second chip through electrode 220.

The chip connection terminal 150 may be disposed between the first semiconductor chip 100 and the second semiconductor chip 200 to electrically connect the first semiconductor chip 100 to the second semiconductor chip 200. For example, the chip connection terminal 150 may be disposed between the first upper chip pad 140 of the first semiconductor chip 100 and the second lower chip pad 230 of the second semiconductor chip 200.

In an example embodiment, the chip connection terminal 150 may include a metal such as silver (Ag), copper (Cu), and aluminum (Al). For example, the chip connection terminal 150 may be a solder ball.

The underfill layer 250 may be disposed between the first semiconductor chip 100 and the second semiconductor chip 200 to surround a side part of the chip connection terminal 150. In addition, the underfill layer 250 may fix the second semiconductor chip 200 onto the first semiconductor chip 100.

In an example embodiment, the underfill layer 250 may include at least any one of an insulating polymer and an epoxy resin. For example, a material of the underfill layer 250 may include an epoxy molding compound (EMC) or non-conductive film (NCF).

The semiconductor package 10 may have a plurality of vertical cooling channels CC_V passing through the first semiconductor chip 100, the second semiconductor chip 200, and the underfill layer 250 in the vertical direction. The plurality of vertical cooling channels CC_V may provide a moving path through which a cooling fluid to be described below flows.

In an example embodiment, the plurality of vertical cooling channels CC_V may be provided in a shape of cylinders (or faceted cylinders) passing through the first semiconductor chip 100, the second semiconductor chip 200, and the underfill layer 250 in the vertical direction.

In an example embodiment, a length (e.g., a width) of each of the plurality of vertical cooling channels CC_V in the horizontal direction may be about 0.5 micrometers to about 100 micrometers. However, the length of each of the plurality of vertical cooling channels CC_V in the horizontal direction is not limited thereto.

The vertical porous structure 270 may be in spaces provided by the plurality of vertical cooling channels CC_V. In addition, the vertical porous structure 270 may have a plurality of cooling holes. For example, the plurality of cooling holes of the vertical porous structure 270 may provide a moving path for the cooling fluid inside the plurality of vertical cooling channels CC_V.

In an example embodiment, a material of the vertical porous structure 270 may include a metal material such as Cu. For example, when the material of the vertical porous structure 270 includes Cu, a coating layer of an insulating material may be formed on the surfaces of the first semiconductor substrate 110 and the second semiconductor substrate 210, which are in contact with the vertical porous structure 270, and the Cu material layer may be provided within the coating layer. However, the material of the vertical porous structure 270 is not limited thereto, and may include, for example, a non-metal material such as Si according to an example embodiments.

The cooling fluid of the semiconductor package 10 may be provided to the inside of each of the plurality of vertical cooling channels CC_V. For example, the cooling fluid may flow inside the plurality of vertical cooling channels CC_V through the plurality of cooling holes of the vertical porous structure 270.

In an example embodiment, a material of the cooling fluid may include a non-conductive material. For example, the material of the cooling fluid may include at least any one of distilled water and a fluorine compound. However, the material of the cooling fluid is not limited thereto.

Because the cooling fluid of the semiconductor package 10 according to an example embodiment of the inventive concept may flow inside the plurality of vertical cooling channels CC_V passing through the first semiconductor chip 100 and the second semiconductor chip 200 in the vertical direction, the first semiconductor chip 100 and the second semiconductor chip 200 may be efficiently cooled down by the cooling fluid. Accordingly, the heat-dissipating performance of the semiconductor package 10 including the first semiconductor chip 100 and the second semiconductor chip 200 may be increased.

FIG. 2 is a cross-sectional view of a semiconductor package 20 according to an example embodiment of the inventive concept.

Referring to FIG. 2, the semiconductor package 20 according to an example embodiment of the inventive concept may include first to fourth semiconductor chips 100 to 400, a plurality of vertical porous structures 270, first to third chip connection terminals 150a to 150c, a lower connection terminal 155, a lower connection pad 157, first to fourth underfill layers 250a to 250d, a lower through electrode 159, a lower support layer 173, an upper support layer 177, a lower porous structure 373, an upper porous structure 375, an upper cooling plate 385, a lower cooling plate 383, a package connection pad 393, and a package connection terminal 395.

Hereinafter, in a description of the semiconductor package 20 of FIG. 2, for convenience of explanation, a description made with respect to the semiconductor package 10 of FIG. 1 is omitted, and differences from the semiconductor package 10 are mainly described.

The first to fourth semiconductor chips 100 to 400 may be stacked in the vertical direction. In addition, the first to fourth semiconductor chips 100 to 400 may be electrically connected through first to third chip through electrodes 120, 220, and 320.

In an example embodiment, the first chip connection terminal 150a may be disposed between the first upper chip pad 140 in the first semiconductor chip 100 and the second lower chip pad 230 in the second semiconductor chip 200 to electrically connect the first semiconductor chip 100 to the second semiconductor chip 200. In addition, the second chip connection terminal 150b may be disposed between the second upper chip pad 240 in the second semiconductor chip 200 and a third lower chip pad 330 in the third semiconductor chip 300 to electrically connect the second semiconductor chip 200 to the third semiconductor chip 300. In addition, the third chip connection terminal 150c may be disposed between a third upper chip pad 340 in the third semiconductor chip 300 and a fourth lower chip pad 430 in the fourth semiconductor chip 400 to electrically connect the third semiconductor chip 300 to the fourth semiconductor chip 400.

In an example embodiment, the lower connection terminal 155 may be attached to the first lower chip pad 130 in the first semiconductor chip 100. In addition, the lower connection terminal 155 may be disposed between the first lower chip pad 130 in the first semiconductor chip 100 and the lower connection pad 157 on the lower support layer 173.

The first underfill layer 250a may be disposed between the lower support layer 173 and the first semiconductor chip 100 to surround the lower connection terminal 155. The first underfill layer 250a may be the lowermost one of the first to fourth underfill layers 250a to 250d. The first underfill layer 250a may also be referred to as a lower underfill layer.

In addition, the second underfill layer 250b may be disposed between the first semiconductor chip 100 and the second semiconductor chip 200 to surround the first chip connection terminal 150a. In addition, the third underfill layer 250c may be disposed between the second semiconductor chip 200 and the third semiconductor chip 300 to surround the second chip connection terminal 150b.

The fourth underfill layer 250d may be disposed between the third semiconductor chip 300 and the fourth semiconductor chip 400 to surround the third chip connection terminal 150c. The fourth underfill layer 250d may be the uppermost one of the first to fourth underfill layers 250a to 250d. The fourth underfill layer 250d may also be referred to as an upper underfill layer.

The lower support layer 173 may be disposed below the first underfill layer 250a. For example, the lower support layer 173 may be disposed between the first underfill layer 250a and the lower porous structure 373. For example, a material of the lower support layer 173 may include Si.

In addition, the upper support layer 177 may be disposed on the fourth semiconductor chip 400. For example, the upper support layer 177 may be disposed between the fourth semiconductor chip 400 and the upper porous structure 375. For example, a material of the upper support layer 177 may include Si. However, embodiments of the inventive concept are not limited thereto. According to example embodiments, the semiconductor package 20 does not include the upper support layer 177.

In an example embodiment, the semiconductor package 20 may include the plurality of vertical cooling channels CC_V passing through the first to fourth semiconductor chips 100 to 400, the first to fourth underfill layers 250a to 250d, the lower support layer 173, and the upper support layer 177 in the vertical direction. The plurality of vertical cooling channels CC_V may provide a moving path through which the cooling fluid to be described below flows.

The vertical porous structure 270 may be in spaces provided by the plurality of vertical cooling channels CC_V. In addition, the vertical porous structure 270 may have a plurality of cooling holes. For example, the plurality of cooling holes of the vertical porous structure 270 may provide a moving path for the cooling fluid inside the plurality of vertical cooling channels CC_V.

In an example embodiment, the semiconductor package 20 may have an upper cooling channel CC_U disposed above the fourth semiconductor chip 400 and connected to the plurality of vertical cooling channels CC_V. The upper cooling channel CC_U may also be referred to as a second horizontal cooling channel.

The upper porous structure 375 may be in a space provided by the upper cooling channel CC_U. For example, the upper porous structure 375 may be disposed between the upper support layer 177 and the upper cooling plate 385. In addition, the upper porous structure 375 may have a plurality of cooling holes. For example, the plurality of cooling holes of the upper porous structure 375 may provide a moving path for the cooling fluid inside the upper cooling channel CC_U. For example, the upper porous structure 375 may include a material same as a material of the vertical porous structure 270.

In an example embodiment, the semiconductor package 20 may have a lower cooling channel CC_L disposed under the first semiconductor chip 100 and connected to the plurality of vertical cooling channels CC_V. The lower cooling channel CC_L may also be referred to as a first horizontal cooling channel.

The lower porous structure 373 may be in a space provided by the lower cooling channel CC_L. For example, the lower porous structure 373 may be disposed between the lower support layer 173 and the lower cooling plate 383. In addition, the lower porous structure 373 may have a plurality of cooling holes. For example, the plurality of cooling holes of the lower porous structure 373 may provide a moving path for the cooling fluid inside the lower cooling channel CC_L. For example, the lower porous structure 373 may include the same material as that of the vertical porous structure 270.

The upper cooling plate 385 may be disposed on the upper porous structure 375. In addition, the upper cooling plate 385 may be configured to cool down the cooling fluid provided to the plurality of cooling holes of the upper porous structure 375.

In an example embodiment, a material of the upper cooling plate 385 may include a non-metal material such as Si. However, the material of the upper cooling plate 385 is not limited thereto. For example, the material of the upper cooling plate 385 may include a metal material having an excellent thermal conductivity such as, for example, Cu.

The lower cooling plate 383 may be disposed below the lower porous structure 373. In addition, the lower cooling plate 383 may be configured to cool down the cooling fluid provided to the plurality of cooling holes of the lower porous structure 373.

In an example embodiment, a material of the lower cooling plate 383 may include a non-metal material such as Si. However, the material of the lower cooling plate 383 is not limited thereto. For example, the material of the lower cooling plate 383 may include a metal material having an excellent thermal conductivity such as, for example, Cu.

The lower through electrode 159 may pass through the lower cooling plate 383, the lower porous structure 373, and the lower support layer 173 in the vertical direction. In addition, the lower through electrode 159 may electrically connect the lower connection pad 157 on the lower support layer 173 to the package connection pad 393 disposed below the lower cooling plate 383. In addition, a lower passivation layer 158 may surround a side part of the lower through electrode 159.

The package connection terminal 395 may be in contact with the package connection pad 393. For example, the package connection terminal 395 may be a solder ball of a metal material including at least any one of Ag, Cu, and Al.

The cooling fluid may be provided to the inside of each of the plurality of vertical cooling channels CC_V, the lower cooling channel CC_L, and the upper cooling channel CC_U. For example, the cooling fluid may flow inside the plurality of vertical cooling channels CC_V, the lower cooling channel CC_L, and the upper cooling channel CC_U through the plurality of cooling holes of the vertical porous structure 270, the lower porous structure 373, and the upper porous structure 375.

In an example embodiment, the material of the cooling fluid may include at least any one of distilled water and a fluorine compound. However, the material of the cooling fluid is not limited thereto.

The cooling fluid according to an example embodiment of the inventive concept may cool down the first to fourth semiconductor chips 100 to 400. In addition, the cooling fluid having received heat from the first to fourth semiconductor chips 100 to 400 may be cooled down by the lower cooling plate 383 and the upper cooling plate 385.

In addition, a portion of the cooling fluid may be heated and vaporized by heat generated from the first to fourth semiconductor chips 100 to 400. Accordingly, a pressure difference may occur among the plurality of vertical cooling channels CC_V, the lower cooling channel CC_L, and the upper cooling channel CC_U, and the cooling fluid may flow inside the plurality of vertical cooling channels CC_V, the lower cooling channel CC_L, and the upper cooling channel CC_U by the pressure difference.

Because the cooling fluid of the semiconductor package 20 according to an example embodiment of the inventive concept may circulate through at least a portion of the first to fourth semiconductor chips 100 to 400, the first to fourth semiconductor chips 100 to 400 may be efficiently cooled down by the cooling fluid. Accordingly, the heat-dissipating performance of the semiconductor package 20 including the first to fourth semiconductor chips 100 to 400 may be increased.

FIG. 3 is a cross-sectional view taken along line III-III' of FIG. 2 according to an example embodiment of the inventive concept.

Referring to FIG. 3, when the semiconductor package 20 is viewed in a plan view, the second chip through electrode 220 may be arranged in a zigzag structure. In addition, the second passivation layer 228 may surround a side part of the second chip through electrode 220.

In an example embodiment, the plurality of vertical cooling channels CC_V may be provided. For example, the plurality of vertical cooling channels CC_V may be disposed between a plurality of second chip through electrodes 220.

In addition, when the semiconductor package 20 is viewed in a plan view, a cross-sectional area of the vertical cooling channel CC_V in the horizontal direction may be greater than a cross-sectional area of the second chip through electrode 220 in the horizontal direction. However, a size of the cross-sectional area of the vertical cooling channel CC_V in the horizontal direction is not limited thereto.

In an example embodiment, the vertical porous structure 270 may be in the spaces provided by the plurality of vertical cooling channels CC_V. In addition, the vertical porous structure 270 may have a plurality of cooling holes. For example, the plurality of cooling holes of the vertical porous structure 270 may provide a moving path for the cooling fluid inside the plurality of vertical cooling channels CC_V.

However, the semiconductor package 20 is not limited thereto. For example, in an example embodiment, the semiconductor package 20 does not include the vertical porous structure 270. That is, in an example embodiment, the plurality of vertical cooling channels CC_V are not filled with the vertical porous structure 270 but filled with only the cooling fluid.

FIG. 4 is a cross-sectional view of a semiconductor package 30 according to an example embodiment of the inventive concept.

Referring to FIG. 4, the semiconductor package 30 according to an example embodiment of the inventive concept may include a semiconductor chip 1000, a chip connection terminal 1550, an underfill layer 1580, a first through electrode 1400, a second through electrode 1200, a support layer 1650, a lower conductive connection pad 1050, a vertical porous structure 1310, a first horizontal porous structure 1330, a second horizontal porous structure 1350, a lower cooling plate 1530, an upper cooling plate 1540, an upper conductive connection pad 1070, and a cooling fluid.

Hereinafter, in a description of the semiconductor package 30 of FIG. 4, for convenience of explanation, a description made with respect to the semiconductor package 10 of FIG. 1 is omitted, and differences from the semiconductor package 10 are mainly described.

The semiconductor chip 1000 may include a semiconductor substrate 1100 having an active layer 1000_AL, and a chip pad 1030 disposed below the semiconductor substrate 1100 and connected to the active layer 1000_AL. In an example embodiment, the semiconductor chip 1000 may include a memory semiconductor chip. However, the semiconductor chip 1000 is not limited thereto, and according to example embodiments, may include a logic semiconductor chip.

In an example embodiment, the chip pad 1030 in the semiconductor chip 1000 may be electrically connected to the second through electrode 1200 to be described below.

The support layer 1650 may be disposed below the semiconductor chip 1000. For example, the support layer 1650 may be disposed between the underfill layer 1580 and the first horizontal porous structure 1330 to be described below. In an example embodiment, a material of the support layer 1650 may include Si. However, the material of the support layer 1650 is not limited thereto.

The lower conductive connection pad 1050 may include a conductive material and may be disposed on the support layer 1650. In addition, one surface of the lower conductive connection pad 1050 may face the active layer 1000_AL in the semiconductor chip 1000.

In an example embodiment, the lower conductive connection pad 1050 may be electrically connected to the first through electrode 1400 to be described below.

The chip connection terminal 1550 may be disposed between the chip pad 1030 in the semiconductor chip 1000 and the lower conductive connection pad 1050 on the support layer 1650. In addition, the chip connection terminal 1550 may electrically connect the first through electrode 1400 to the second through electrode 1200.

The underfill layer 1580 may be disposed between the semiconductor chip 1000 and the support layer 1650 to surround the chip connection terminal 1550. In an example embodiment, the underfill layer 1580 may include at least any one of an insulating polymer and an epoxy resin. For example, a material of the underfill layer 1580 may include an EMC or NCF.

The semiconductor package 30 may have the plurality of vertical cooling channels CC_V passing through the semiconductor chip 1000, the underfill layer 1580, and the support layer 1650 in the vertical direction. The plurality of vertical cooling channels CC_V may provide a moving path through which the cooling fluid to be described below flows.

In an example embodiment, a length (e.g., a width) of each of the plurality of vertical cooling channels CC_V in the horizontal direction may be about 0.5 micrometers to about 100 micrometers.

The vertical porous structure 1310 may be in spaces provided by the plurality of vertical cooling channels CC_V. In addition, the vertical porous structure 1310 may have a plurality of cooling holes. For example, the plurality of cooling holes of the vertical porous structure 1310 may provide a moving path for the cooling fluid inside the plurality of vertical cooling channels CC_V.

In an example embodiment, a material of the vertical porous structure 1310 may include a metal material such as Cu. For example, when the material of the vertical porous structure 1310 includes Cu, a coating layer of an insulating material may be formed on the surface of the semiconductor substrate 1100 in contact with the vertical porous structure 1310. However, the material of the vertical porous structure 1310 is not limited thereto, and according to example embodiments, may include a non-metal material.

The semiconductor package 30 may include the lower cooling channel CC_L disposed under the semiconductor chip 1000 and connected to the plurality of vertical cooling channels CC_V.

The first horizontal porous structure 1330 may be in a space provided by the lower cooling channel CC_L. For example, the first horizontal porous structure 1330 may be disposed between the support layer 1650 and the lower cooling plate 1530. In addition, the first horizontal porous structure 1330 may have a plurality of cooling holes. For example, the plurality of cooling holes of the first horizontal porous structure 1330 may provide a moving path for the cooling fluid inside the lower cooling channel CC_L.

The semiconductor package 30 may include the upper cooling channel CC_U disposed above the semiconductor chip 1000 and connected to the plurality of vertical cooling channels CC_V.

The second horizontal porous structure 1350 may be in a space provided by the upper cooling channel CC_U. For example, the second horizontal porous structure 1350 may be disposed between the semiconductor chip 1000 and the upper cooling plate 1540. In addition, the second horizontal porous structure 1350 may have a plurality of cooling holes. For example, the plurality of cooling holes of the second horizontal porous structure 1350 may provide a moving path for the cooling fluid inside the upper cooling channel CC_U.

The upper cooling plate 1540 may be disposed on the second horizontal porous structure 1350. In addition, the upper cooling plate 1540 may be configured to cool down the cooling fluid provided to the plurality of cooling holes of the second horizontal porous structure 1350.

In an example embodiment, a material of the upper cooling plate 1540 may include a non-metal material such as Si. However, the material of the upper cooling plate 1540 is not limited thereto.

The lower cooling plate 1530 may be disposed below the first horizontal porous structure 1330. In addition, the lower cooling plate 1530 may be configured to cool down the cooling fluid provided to the plurality of cooling holes of the first horizontal porous structure 1330.

In an example embodiment, a material of the lower cooling plate 1530 may include a non-metal material such as Si. However, the material of the lower cooling plate 1530 is not limited thereto.

The first through electrode 1400 may be electrically connected to the lower conductive connection pad 1050 by passing through the support layer 1650, the first horizontal porous structure 1330, and the lower cooling plate 1530 in the vertical direction.

In an example embodiment, the first passivation layer 1450 may surround at least a portion of the first through electrode 1400. For example, a material of the first passivation layer 1450 may include SiON, SiO$_2$, SiOCN, SiCN, or a combination thereof.

In an example embodiment, a first insulating wall 1480 may surround a side part of the first passivation layer 1450. For example, the first insulating wall 1480 may extend in the vertical direction from a portion of the semiconductor substrate 1100 and surround the side part of the first passivation layer 1450.

In an example embodiment, a material of the first insulating wall 1480 may include Si. In addition, the first insulating wall 1480 may be integrated with the support layer 1650.

The second through electrode 1200 may be electrically connected to the chip pad 1030 by passing through the upper cooling plate 1540, the second horizontal porous structure 1350, and the semiconductor chip 1000 in the vertical direction.

In an example embodiment, a second passivation layer 1250 may surround at least a portion of the second through electrode 1200. For example, a material of the second passivation layer 1250 may include SiON, SiO$_2$, SiOCN, SiCN, or a combination thereof.

In an example embodiment, a second insulating wall 1280 may surround a side part of the second passivation layer 1250. For example, the second insulating wall 1280 may extend in the vertical direction from a portion of the semiconductor substrate 1100 and surround the side part of the second passivation layer 1250.

In an example embodiment, a material of the second insulating wall 1280 may include Si. In addition, the second insulating wall 1280 may be integrated with the semiconductor substrate 1100.

The upper conductive connection pad 1070 may be disposed on the upper cooling plate 1540 and in contact with the second through electrode 1200. In addition, the upper conductive connection pad 1070 may be configured to electrically connect a separate semiconductor device mounted on the semiconductor package 30 to the semiconductor chip 1000.

The cooling fluid may be provided to the inside of the plurality of vertical cooling channels CC_V, the lower cooling channel CC_L, and the upper cooling channel CC_U. For example, the cooling fluid may flow inside the plurality of vertical cooling channels CC_V, the lower cooling channel CC_L, and the upper cooling channel CC_U through the plurality of cooling holes of the vertical porous structure 1310, the first horizontal porous structure 1330, and the second horizontal porous structure 1350.

In an example embodiment, the material of the cooling fluid may include at least any one of distilled water and a fluorine compound. However, the material of the cooling fluid is not limited thereto.

The cooling fluid according to an example embodiment of the inventive concept may cool down the semiconductor chip 1000. In addition, the cooling fluid having received heat from the semiconductor chip 1000 may be cooled down by the lower cooling plate 1530 and the upper cooling plate 1540.

In addition, the cooling fluid may be heated and vaporized by heat generated from the semiconductor chip 1000. Accordingly, a pressure difference may occur among the plurality of vertical cooling channels CC_V, the lower cooling channel CC_L, and the upper cooling channel CC_U, and the cooling fluid may flow inside the plurality of vertical cooling channels CC_V, the lower cooling channel CC_L, and the upper cooling channel CC_U by the pressure difference.

Because the cooling fluid of the semiconductor package 30 according to an example embodiment of the inventive concept may circulate through at least a portion of the semiconductor chip 1000, the semiconductor chip 1000 may be efficiently cooled down by the cooling fluid. Accordingly, the heat-dissipating performance of the semiconductor package 30 including the semiconductor chip 1000 may be increased.

FIG. 5 is a cross-sectional view of a semiconductor package 40 according to an example embodiment of the inventive concept.

Referring to FIG. 5, the semiconductor package 40 according to an example embodiment of the inventive concept may include first to fourth semiconductor chips 1000 to 4000, first to third through electrodes 5000a to 5000c, a lower through electrode 5100, first to fourth support layers 1730 to 4730, first to fourth lower conductive connection pads 1050 to 4050, first to fourth underfill layers 1580 to 4580, first to fourth chip connection terminals 1550 to 4550, a vertical porous structure 6000, first to third horizontal porous structures 6200 to 6400, a lowermost porous structure 6100, an uppermost porous structure 6500, an upper cooling plate 5550, a lower cooling plate 5530, a package connection pad 7030, a package connection terminal 7050, and a cooling fluid.

Hereinafter, in a description of the semiconductor package 40 of FIG. 5, for convenience of explanation, a description made with respect to the semiconductor package 30 of FIG. 4 is omitted, and differences from the semiconductor package 30 are mainly described.

The first to fourth semiconductor chips 1000 to 4000 may include first to fourth semiconductor substrates 1100 to 4100 having first to fourth active layers 1000_AL to 4000_AL, respectively. In addition, the first to fourth active layers 1000_AL to 4000_AL may include a plurality of individual devices. In addition, the first to fourth semiconductor chips 1000 to 4000 may include first to fourth chip pads 1030 to 4030 disposed on the first to fourth semiconductor substrates 1100 to 4100 and electrically connected to the plurality of individual devices in the first to fourth active layers 1000_AL to 4000_AL, respectively.

The first to fourth support layers 1730 to 4730 may be disposed under the first to fourth semiconductor chips 1000 to 4000, respectively. In an example embodiment, a material of the first to fourth support layers 1730 to 4730 may include Si.

The first to fourth lower conductive connection pads 1050 to 4050 may be disposed on the first to fourth support layers 1730 to 4730, respectively. In addition, the first to fourth lower conductive connection pads 1050 to 4050 may face the first to fourth semiconductor chips 1000 to 4000, respectively.

The first to fourth chip connection terminals 1550 to 4550 may be disposed between the first to fourth chip pads 1030 to 4030 and the first to fourth lower conductive connection pads 1050 to 4050, respectively.

The first to fourth underfill layers 1580 to 4580 may be disposed between the first to fourth semiconductor chips 1000 to 4000 and the first to fourth support layers 1730 to 4730, respectively, and surround the first to fourth chip connection terminals 1550 to 4550, respectively. In an example embodiment, the first to fourth underfill layers 1580 to 4580 may include an EMC.

In an example embodiment, the semiconductor package 40 may have first to third horizontal cooling channels CC_H1 to CC_H3 respectively disposed between the first to fourth semiconductor chips 1000 to 4000.

The first to third horizontal porous structures 6200 to 6400 may be in spaces provided by the first to third horizontal cooling channels CC_H1 to CC_H3, respectively. In an example embodiment, the first to third horizontal porous structures 6200 to 6400 may have a plurality of cooling holes. For example, the plurality of cooling holes of the first to third horizontal porous structures 6200 to 6400 may provide a moving path for the cooling fluid inside the first to third horizontal cooling channels CC_H1 to CC_H3.

In an example embodiment, the semiconductor package 40 may have a lowermost cooling channel CC_LM disposed under the first semiconductor chip 1000. In addition, the lowermost porous structure 6100 may be in a space provided by the lowermost cooling channel CC_LM.

In an example embodiment, the lowermost porous structure 6100 may have a plurality of cooling holes. For example, the plurality of cooling holes of the lowermost porous structure 6100 may provide a moving path for the cooling fluid inside the lowermost cooling channel CC_LM.

In an example embodiment, the semiconductor package 40 may have an uppermost cooling channel CC_UM disposed on the fourth semiconductor chip 4000. In addition, the uppermost porous structure 6500 may be in the space provided by the uppermost cooling channel CC_UM.

In an example embodiment, the uppermost porous structure 6500 may have a plurality of cooling holes. For example, the plurality of cooling holes of the upperrmost porous structure 6500 may provide a moving path for the cooling fluid inside the uppermost cooling channel CC_UM.

In an example embodiment, the semiconductor package 40 may have a vertical cooling channel CC_V connecting the first to third horizontal cooling channels CC_H1 to CC_H3, an uppermost cooling channel CC_UM, and the lowermost cooling channel CC_LM by passing through the first to fourth semiconductor chips 1000 to 4000, the first to fourth underfill layers 1580 to 4580, and the first to fourth support layers 1730 to 4730 in the vertical direction.

In an example embodiment, the vertical porous structure 6000 may have a plurality of cooling holes. For example, the plurality of cooling holes of the vertical porous structure 6000 may provide a moving path for the cooling fluid inside the vertical cooling channel CC_V.

The first to third through electrodes 5000a to 5000c may electrically connect the first to fourth semiconductor chips 1000 to 4000 by passing through the first to third semiconductor chips 1000 to 3000, the first to third horizontal porous structures 6200 to 6400, and the second to fourth support layers 2730 to 4730 in the vertical direction.

In addition, first to third passivation layers 5050a to 5050c may surround at least portions of the first to third through electrodes 5000a to 5000c, respectively. For example, the first to third passivation layers 5050a to 5050c may surround portions of the first to third through electrodes 5000a to

5000c exposed to the first to third horizontal porous structures 6200 to 6400, respectively.

The upper cooling plate 5550 may be disposed above the uppermost porous structure 6500 and configured to cool down the cooling fluid provided to the plurality of cooling holes of the uppermost porous structure 6500.

In addition, the lower cooling plate 5530 may be disposed under the lowermost porous structure 6100 and configured to cool down the cooling fluid provided to the plurality of cooling holes of the lowermost porous structure 6100.

In an example embodiment, a material of the upper cooling plate 5550 and the lower cooling plate 5530 may include a non-metal material such as Si. However, the material of the upper cooling plate 5550 and the lower cooling plate 5530 is not limited thereto.

The lower through electrode 5100 may be electrically connected to the first semiconductor chip 1000 by passing through the lower cooling plate 5530, the lowermost porous structure 6100, and the first support layer 1730 in the vertical direction. In an example embodiment, one side of the lower through electrode 5100 may be connected to the lower conductive connection pad 1050, and the other side of the lower through electrode 5100 may be connected to the package connection pad 7030. In addition, a lower passivation layer 5150 may surround at least a portion of a side surface of the lower through electrode 5100.

The package connection pad 7030 may be disposed below the lower cooling plate 5530 and electrically connected to the lower through electrode 5100. In addition, the package connection terminal 7050 may be attached to the package connection pad 7030. In an example embodiment, the package connection terminal 7050 may be electrically connected to the first to fourth semiconductor chips 1000 to 4000 via the lower through electrode 5100 and the first to third through electrodes 5000a to 5000c.

The cooling fluid may be provided to the inside of each of the first to third horizontal cooling channels CC_H1 to CC_H3, the uppermost cooling channel CC_UM, the lowermost cooling channel CC_LM, and the vertical cooling channel CC_V. For example, the cooling fluid may flow inside the first to third horizontal cooling channels CC_H1 to CC_H3, the uppermost cooling channel CC_UM, the lowermost cooling channel CC_LM, and the vertical cooling channel CC_V through the plurality of cooling holes of the first to third horizontal porous structures 6200 to 6400, the uppermost porous structure 6500, the lowermost porous structure 6100, and the vertical porous structure 6000.

In an example embodiment, the material of the cooling fluid may include at least any one of distilled water and a fluorine compound. However, the material of the cooling fluid is not limited thereto.

The cooling fluid according to an example embodiment of the inventive concept may cool down the first to fourth semiconductor chips 1000 to 4000. In addition, the cooling fluid having received heat from the first to fourth semiconductor chips 1000 to 4000 may be cooled down by the lower cooling plate 5530 and the upper cooling plate 5550.

In addition, the cooling fluid may be heated and vaporized by heat generated from the first to fourth semiconductor chips 1000 to 4000. Accordingly, a pressure difference may occur among the first to third horizontal cooling channels CC_H1 to CC_H3, the uppermost cooling channel CC_UM, the lowermost cooling channel CC_LM, and the vertical cooling channel CC_V, and the cooling fluid may flow inside the first to third horizontal cooling channels CC_H1 to CC_H3, the uppermost cooling channel CC_UM, the lowermost cooling channel CC_LM, and the vertical cooling channel CC_V by the pressure difference.

Because the cooling fluid of the semiconductor package 40 according to an example embodiment of the inventive concept may circulate through at least a portion of the first to fourth semiconductor chips 1000 to 4000, the first to fourth semiconductor chips 1000 to 4000 may be efficiently cooled down by the cooling fluid. Accordingly, the heat-dissipating performance of the semiconductor package 40 including the first to fourth semiconductor chips 1000 to 4000 may be increased.

FIG. 6 is a cross-sectional view taken along line VI-VI' of FIG. 5 according to an example embodiment of the inventive concept.

Referring to FIG. 6, when the semiconductor package 40 is viewed in a plan view, the second through electrode 5000b may be arranged in a zigzag structure. In addition, a second passivation layer 5050b may surround a side part of the second through electrode 5000b.

In an example embodiment, the plurality of vertical cooling channels CC_V may be provided. For example, the plurality of vertical cooling channels CC_V may be disposed between a plurality of second through electrodes 5000b.

In addition, the vertical cooling channel CC_V may be connected to the second horizontal cooling channel CC_H2. For example, the plurality of cooling holes of the vertical porous structure 6000 may be connected to the plurality of cooling holes of the second horizontal porous structure 6300. In addition, the plurality of cooling holes of the vertical porous structure 6000 and the plurality of cooling holes of the second horizontal porous structure 6300 may provide a moving path for the cooling fluid.

In an example embodiment, when the semiconductor package 40 is viewed in a plan view, a cross-sectional area of the vertical cooling channel CC_V in the horizontal direction may be greater than a cross-sectional area of the second through electrode 5000b in the horizontal direction. However, a size of the cross-sectional area of the vertical cooling channel CC_V in the horizontal direction is not limited thereto.

However, the semiconductor package 40 is not limited thereto, and according to example embodiments, the semiconductor package 40 does not include the vertical porous structure 6000. That is, in an example embodiment, the vertical cooling channel CC_V is not filled with the vertical porous structure 6000, but rather, is filled with only the cooling fluid.

Figure 7:
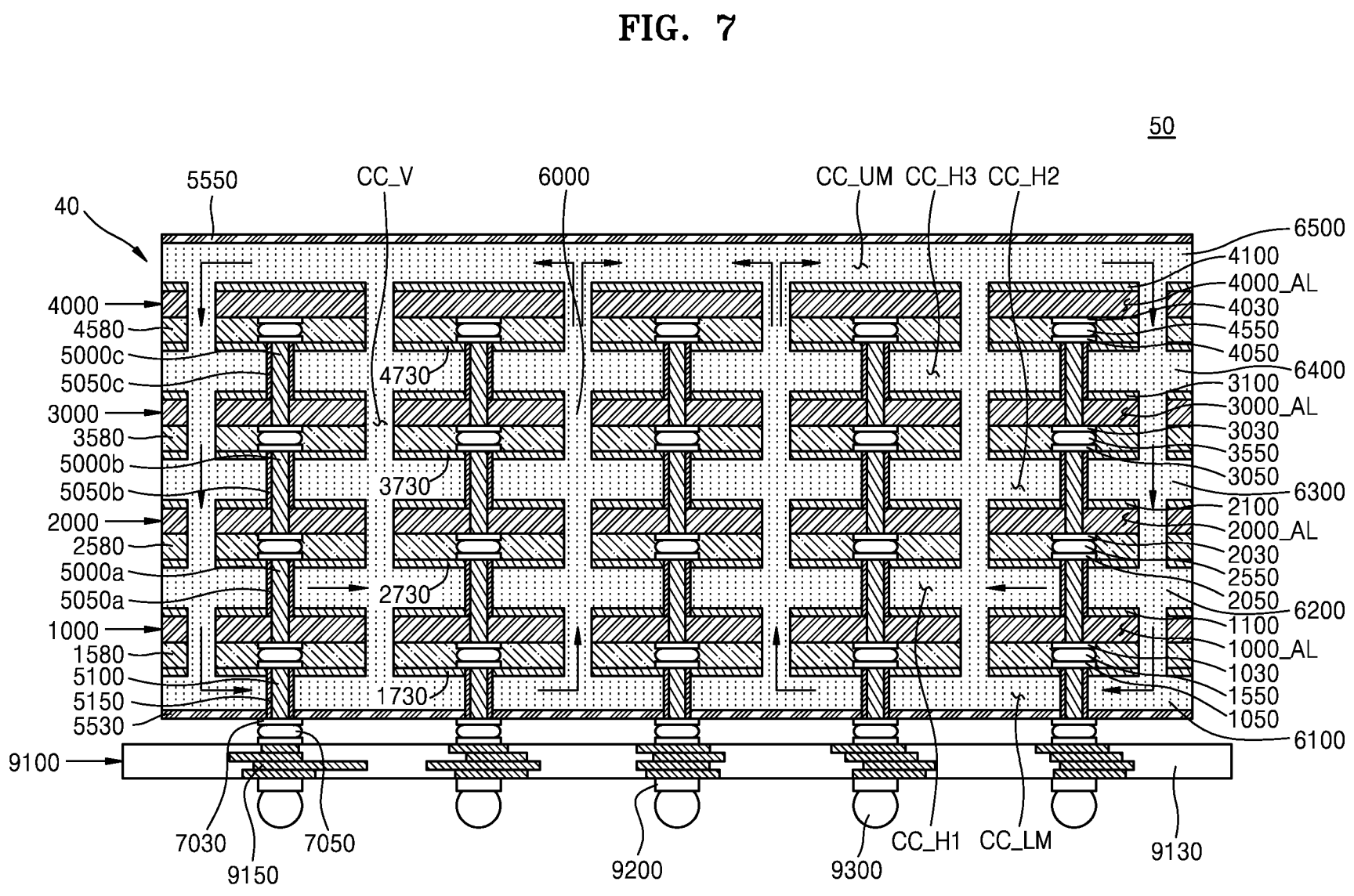

FIG. 7 is a cross-sectional view of a semiconductor package 50 according to an example embodiment of the inventive concept.

Referring to FIG. 7, the semiconductor package 50 may further include a package substrate 9100, an external connection pad 9200, and an external connection terminal 9300 in addition to the semiconductor package 40.

The package substrate 9100 may support the semiconductor package 40 of FIG. 5 and be electrically connected to the first to fourth semiconductor chips 1000 to 4000.

In an example embodiment, the package substrate 9100 may be a printed circuit board (PCB). For example, the package substrate 9100 may be a multi-layer PCB.

The package substrate 9100 may include a substrate insulating layer 9130 and a wiring pattern 9150 extending inside the substrate insulating layer 9130. In an example embodiment, the wiring pattern 9150 may be electrically connected to the package connection terminal 7050 described with reference to FIG. 5.

A material of the substrate insulating layer 9130 may include at least any one of a phenol resin, an epoxy resin, and polyimide. For example, the substrate insulating layer 9130 may include at least any one material among frame retardant 4 (FR4), tetrafunctional epoxy, polyphenylene ether, epoxy/polyphenylene oxide, bismaleimide triazine (BT), Thermount, cyanate ester, polyimide, and liquid crystal polymer.

In addition, the wiring pattern 9150 may include electro-lytically deposited (ED) copper, rolled-annealed (RA) copper foil, stainless steel foil, aluminum foil, ultra-thin copper foil, sputtered copper, copper alloy, nickel, stainless steel, beryllium copper, etc.

The external connection pad 9200 may be disposed below the package substrate 9100 and electrically connected to the wiring pattern 9150. In addition, the external connection pad 9200 may include a conductive material provided to attach the external connection terminal 9300 thereto.

The external connection terminal 9300 may be attached to the external connection pad 9200. In addition, the external connection terminal 9300 may be configured to electrically connect the semiconductor package 50 of embodiments of the inventive concept to an external device.

Hereinafter, a method of manufacturing a semiconductor package, according to an example embodiment of the inventive concept, is described in detail with reference to FIGS. 8 to 21. FIGS. 8 to 21 are cross-sectional views illustrating operations of a method of manufacturing a semiconductor package, according to an example embodiment of the inventive concept. The method of manufacturing a semiconductor package, according to an example embodiment of the inventive concept, may be a method of manufacturing the semiconductor package 30 described with reference to FIG. 4.

Figure 8:
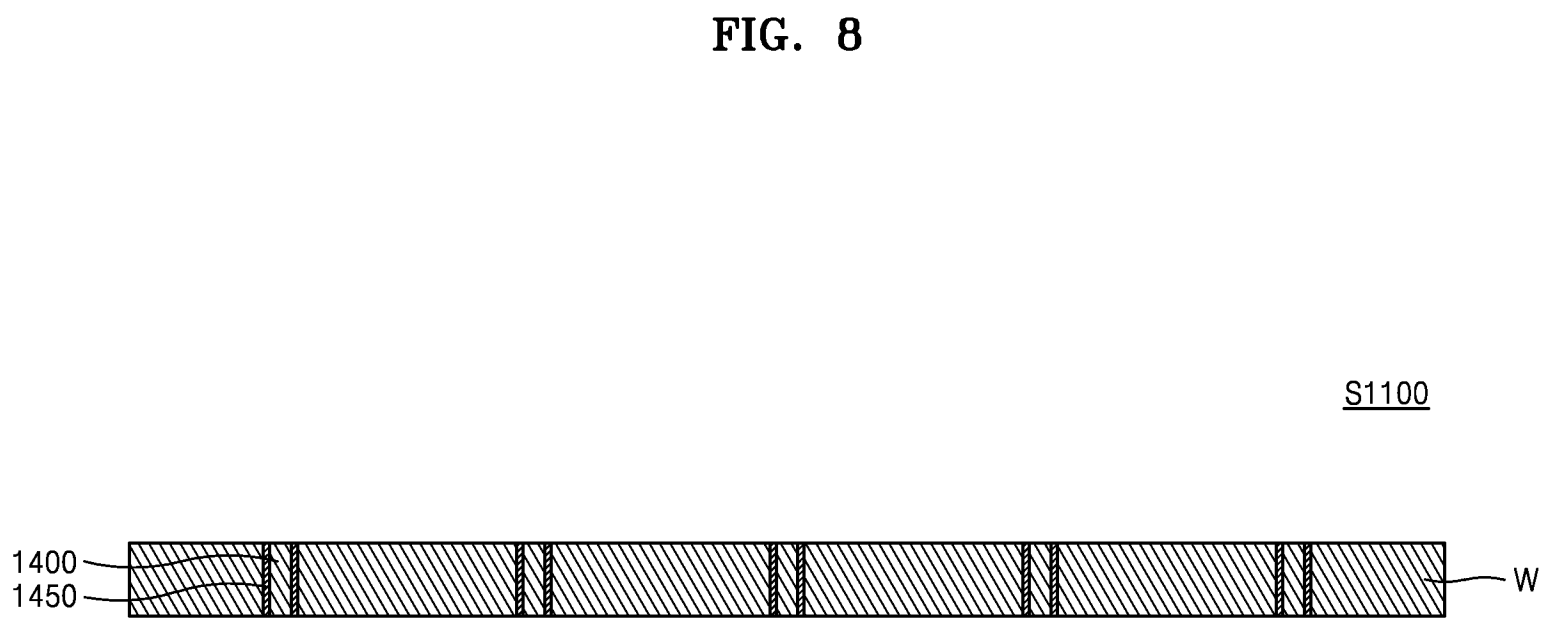

Referring to FIG. 8, the method of manufacturing a semiconductor package, according to an example embodiment of the inventive concept, may include operation S1100 of forming the first through electrode 1400 in a semiconductor substrate W.

The semiconductor substrate W provided in operation S1100 may be a wafer formed from Si. In an example embodiment, operation S1100 may include the operations of forming a plurality of through holes passing through the semiconductor substrate W in the vertical direction, and forming the first through electrode 1400 in the plurality of through holes.

In an example embodiment, in operation S1100, the plurality of through holes may be formed by a laser drilling process performed on the semiconductor substrate W.

In an example embodiment, in operation S1100, the first passivation layer 1450 may cover inner surfaces of the semiconductor substrate W, which define the plurality of through holes. In addition, in operation S1100, the first through electrode 1400 may fill the plurality of through holes by a plating process.

Figure 9:
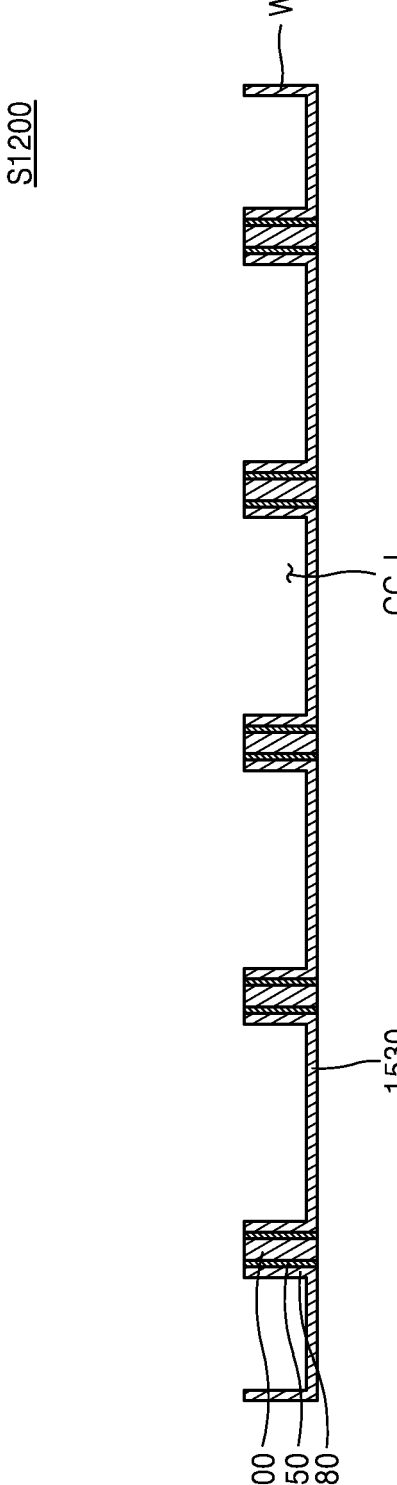

Referring to FIG. 9, the method of manufacturing a semiconductor package, according to an example embodiment of the inventive concept, may include operation S1200 of removing at least a portion of the semiconductor substrate W.

In an example embodiment, in operation S1200, the at least a portion of the semiconductor substrate W, which is disposed outside of the first through electrode 1400, may be removed by an etching process. For example, the at least a portion of the semiconductor substrate W may be removed by at least any one of a wet etching process, a dry etching process, and a plasma etching process.

In operation S1200, at least a portion of the semiconductor substrate W may surround a side part of the first through electrode 1400. The at least a portion of the semiconductor substrate W surrounding the side part of the first through electrode 1400 may form the first insulating wall 1480 described with reference to FIG. 4. For example, the first insulating wall 1480 may surround a side part of the first passivation layer 1450.

In addition, in operation S1200, spaces between a plurality of first through electrodes 1400, which are formed by removing the at least a portion of the semiconductor substrate W, may form the lower cooling channel CC_L described with reference to FIG. 4.

Figure 10:
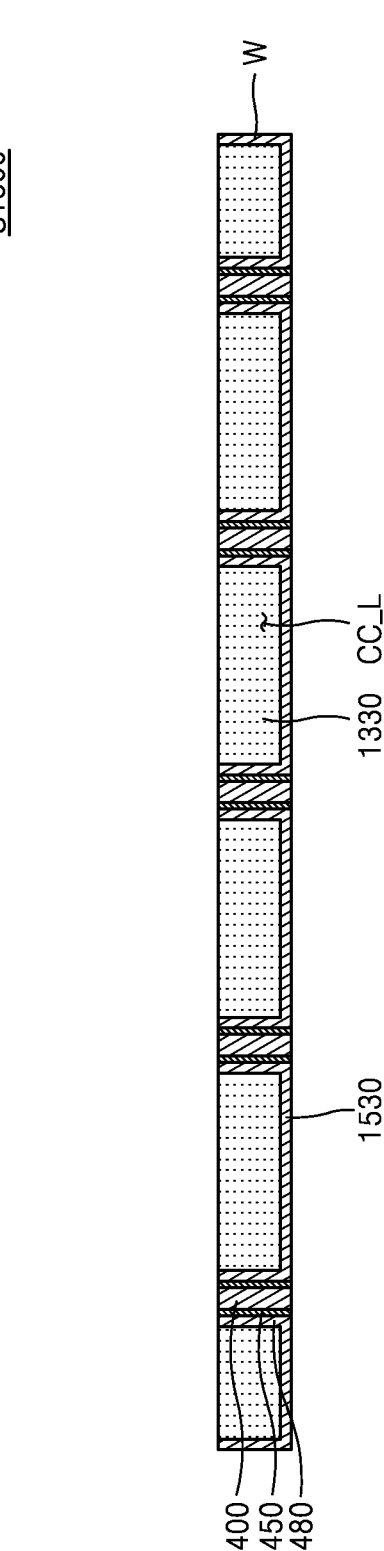

Referring to FIG. 10, the method of manufacturing a semiconductor package, according to an example embodiment of the inventive concept, may include operation S1300 of filling the lower cooling channel CC_L with the first horizontal porous structure 1330.

The first horizontal porous structure 1330 formed in operation S1300 may have a plurality of cooling holes. For example, the plurality of cooling holes of the first horizontal porous structure 1330 may provide a moving path for the cooling fluid.

Figure 11:
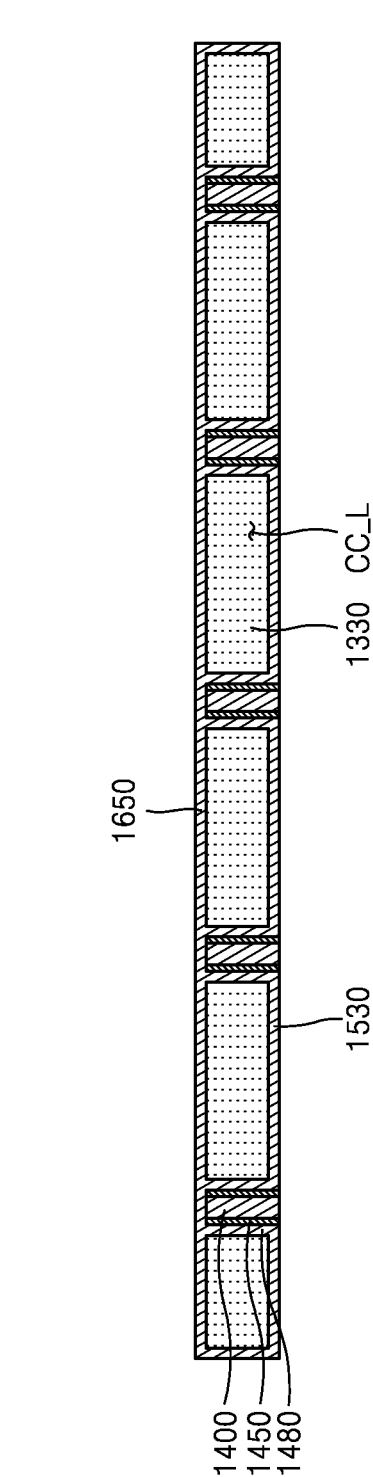

Referring to FIG. 11, the method of manufacturing a semiconductor package, according to an example embodiment of the inventive concept, may include operation S1400 of forming the support layer 1650 on the first horizontal porous structure 1330.

In an example embodiment, a material of the support layer 1650 formed in operation S1400 may include Si. For example, the support layer 1650 may be a wafer. In operation S1400, the support layer 1650 may cover an upper surface of the first horizontal porous structure 1330 and an upper surface of the first through electrode 1400.

Figure 12:
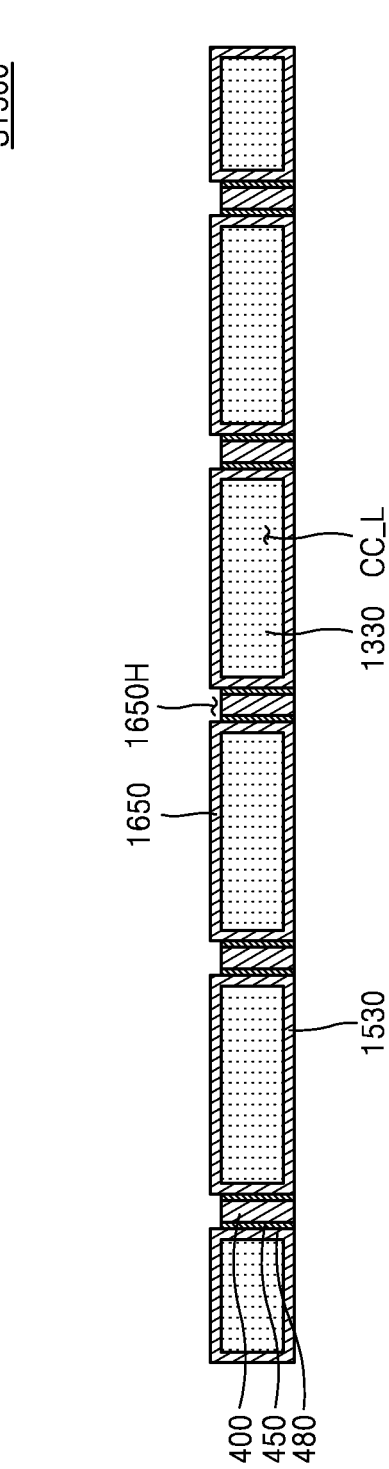

Referring to FIG. 12, the method of manufacturing a semiconductor package, according to an example embodiment of the inventive concept, may include operation S1500 of etching a portion of the support layer 1650 to expose a portion of the first through electrode 1400.

In operation S1500, by removing the portion of the support layer 1650 overlapping the first through electrode 1400 and the first passivation layer 1450 in the vertical direction, an etching hole 1650H may be formed in the support layer 1650. In addition, the upper surface of the first through electrode 1400 and an upper surface of the first passivation layer 1450 may be exposed through the etching hole 1650H.

Figure 13:
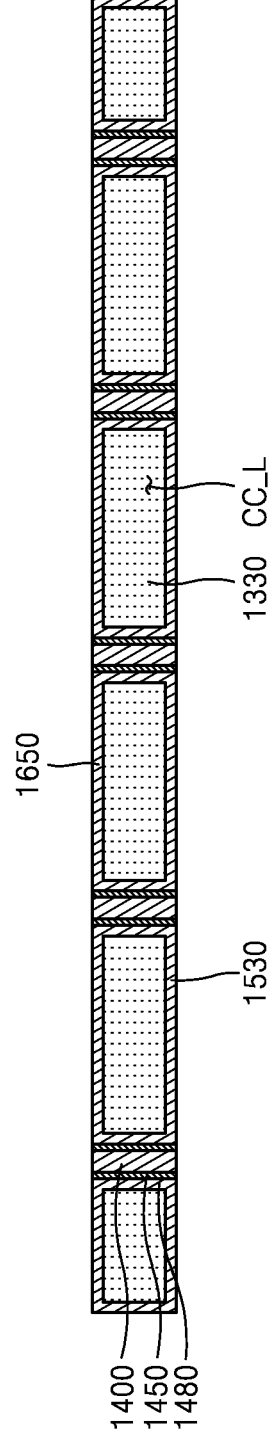

Referring to FIG. 13, the method of manufacturing a semiconductor package, according to an example embodiment of the inventive concept, may include operation S1600 of forming the first through electrode 1400 in the etching hole 1650H of the support layer 1650.

In an example embodiment, in operation S1600, the first passivation layer 1450 may cover inner surfaces of the support layer 1650, which define a plurality of etching holes 1650H. In addition, in operation S1600, the first through electrode 1400 may fill the plurality of etching holes 1650H by a plating process.

Figure 14:
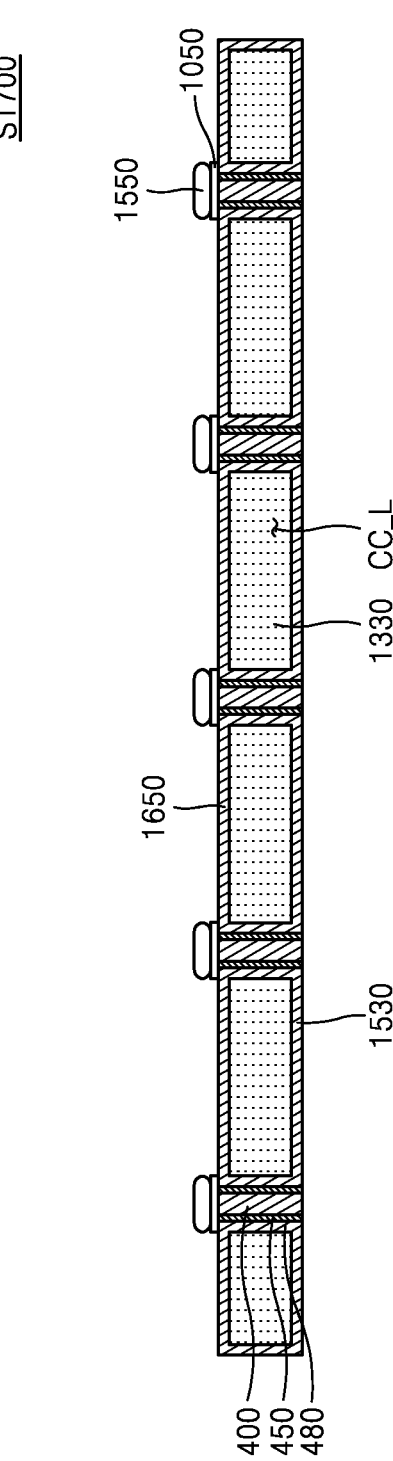

Referring to FIG. 14, the method of manufacturing a semiconductor package, according to an example embodiment of the inventive concept, may include operation S1700 of forming the lower conductive connection pad 1050 and the chip connection terminal 1550 on the support layer 1650.

In operation S1700, the lower conductive connection pad 1050 may be disposed on the support layer 1650 and electrically connected to the first through electrode 1400. In an example embodiment, the lower conductive connection pad 1050 may be formed by a photolithography process and a plating process.

In addition, in operation S1700, the chip connection terminal 1550 may be attached to one surface of the lower conductive connection pad 1050. For example, the chip connection terminal 1550 may be attached to the one surface of the lower conductive connection pad 1050 by a soldering process.

Figure 15:
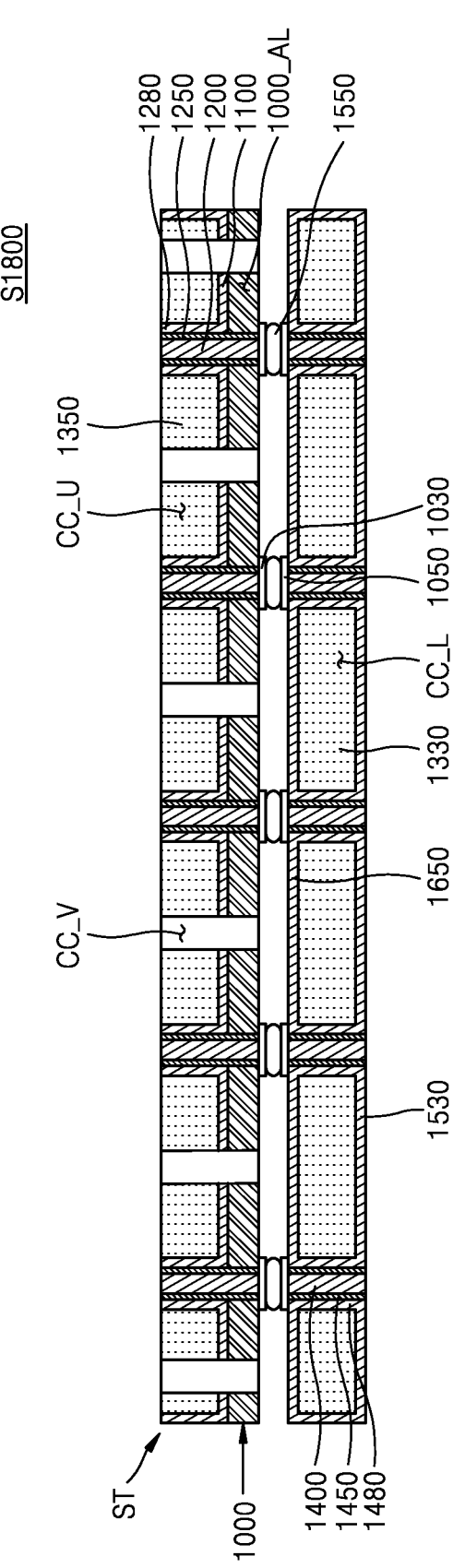

Referring to FIG. 15, the method of manufacturing a semiconductor package, according to an example embodiment of the inventive concept, may include operation S1800 of mounting a semiconductor structure ST on the structure of FIG. 14.

The semiconductor structure ST shown in FIG. 15 may include the semiconductor chip 1000 having the active layer 1000_AL, the second through electrode 1200, the second passivation layer 1250, the second insulating wall 1280, and the second horizontal porous structure 1350 forming the upper cooling channel CC_U. In addition, the semiconductor structure ST may have the plurality of vertical cooling channels CC_V passing through the semiconductor chip 1000 and the second horizontal porous structure 1350 in the vertical direction.

A description of technical aspects and components included in the semiconductor structure ST has been described with reference to FIG. 4, and for convenience of explanation, a further detailed description thereof is omitted herein.

In operation S1800, the chip pad 1030 in the semiconductor chip 1000 may be in contact (e.g., direct contact) with the chip connection terminal 1550. Accordingly, a plurality of individual devices in the active layer 1000_AL of the semiconductor chip 1000 may be electrically connected to the first through electrode 1400 via the chip connection terminal 1550.

Figure 16:
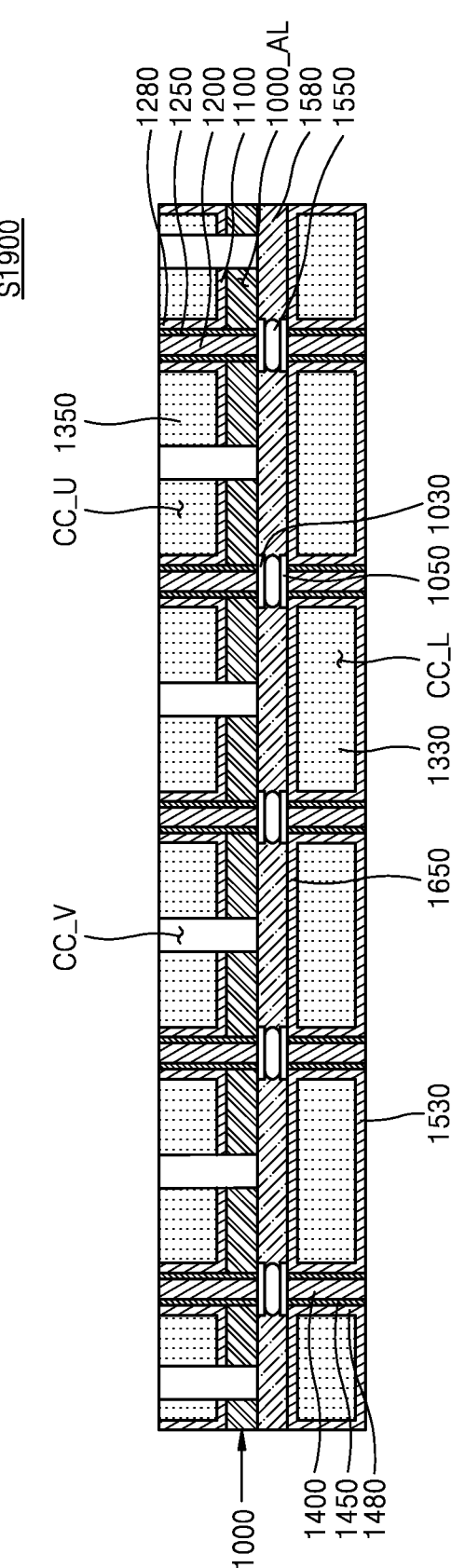

Referring to FIG. 16, the method of manufacturing a semiconductor package, according to an example embodiment of the inventive concept, may include operation S1900 of forming the underfill layer 1580 between the semiconductor chip 1000 and the support layer 1650.

In operation S1900, an underfill member such as an EMC may be injected into a space between the semiconductor chip 1000 and the support layer 1650. Accordingly, the underfill member may form the underfill layer 1580 surrounding the chip connection terminal 1550 between the semiconductor chip 1000 and the support layer 1650.

Figure 17:
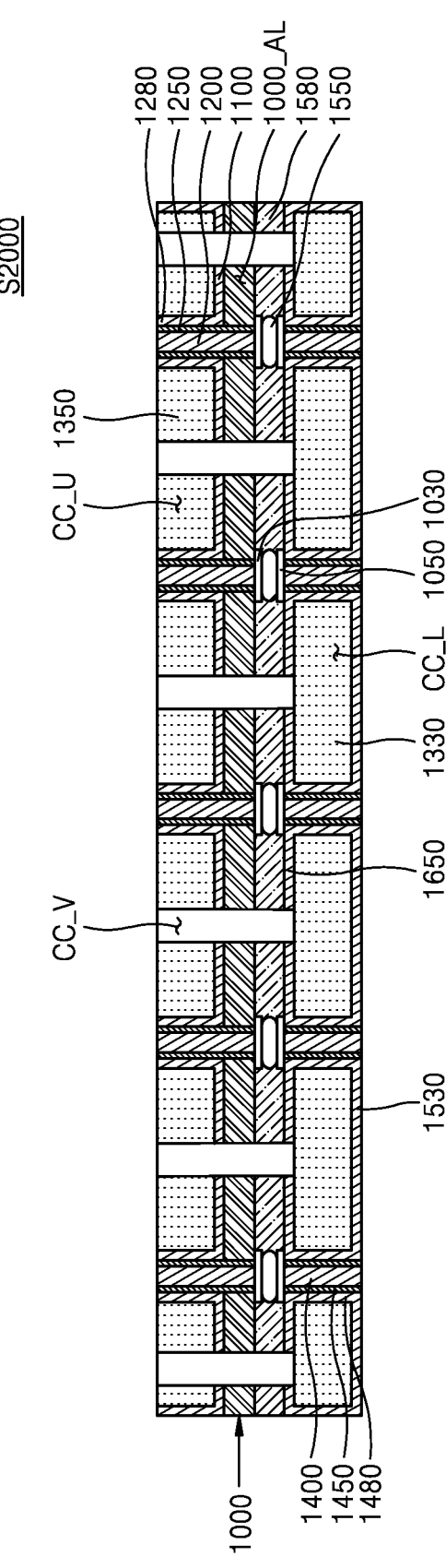

Referring to FIG. 17, the method of manufacturing a semiconductor package, according to an example embodiment of the inventive concept, may include operation S2000 of removing at least a portion of the underfill layer 1580, the support layer 1650, and the first horizontal porous structure 1330, which overlaps the plurality of vertical cooling channels CC_V of the semiconductor structure ST in the vertical direction.

In an example embodiment, in operation S2000, the at least a portion of the underfill layer 1580, the support layer 1650, and the first horizontal porous structure 1330, which overlaps the plurality of vertical cooling channels CC_V in the vertical direction, may be removed by a laser drilling process.

In an example embodiment, after performing operation S2000, the vertical cooling channel CC_V may connect the upper cooling channel CC_U of the second horizontal porous structure 1350 to the lower cooling channel CC_L of the first horizontal porous structure 1330. That is, after performing operation S2000, the vertical cooling channel CC_V, the upper cooling channel CC_U, and the lower cooling channel CC_L may be connected.

Figure 18:
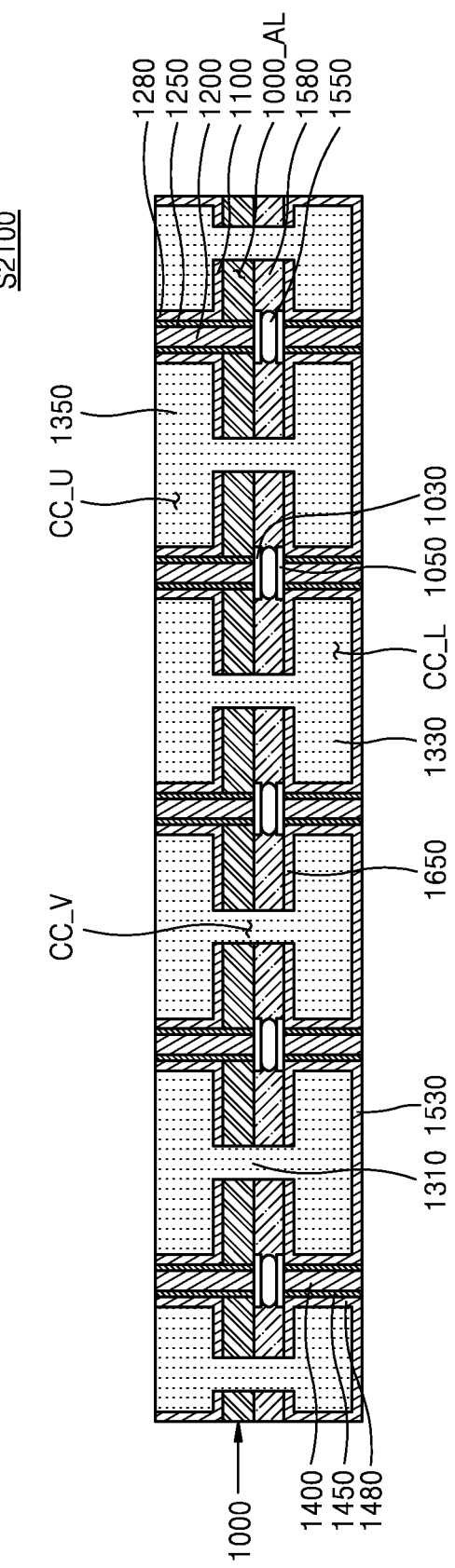

Referring to FIG. 18, the method of manufacturing a semiconductor package, according to an example embodiment of the inventive concept, may include operation S2100 of filling a space of the vertical cooling channel CC_V with the vertical porous structure 1310.

In an example embodiment, the vertical porous structure 1310 formed in operation S2100 may have a plurality of cooling holes. For example, the plurality of cooling holes of the vertical porous structure 1310 may provide a moving path for the cooling fluid.

In an example embodiment, materials of the vertical porous structure 1310, the second horizontal porous structure 1350, and the first horizontal porous structure 1330 may be substantially the same. Accordingly, the vertical porous structure 1310, the second horizontal porous structure 1350, and the first horizontal porous structure 1330 may be integrated.

Figure 19:
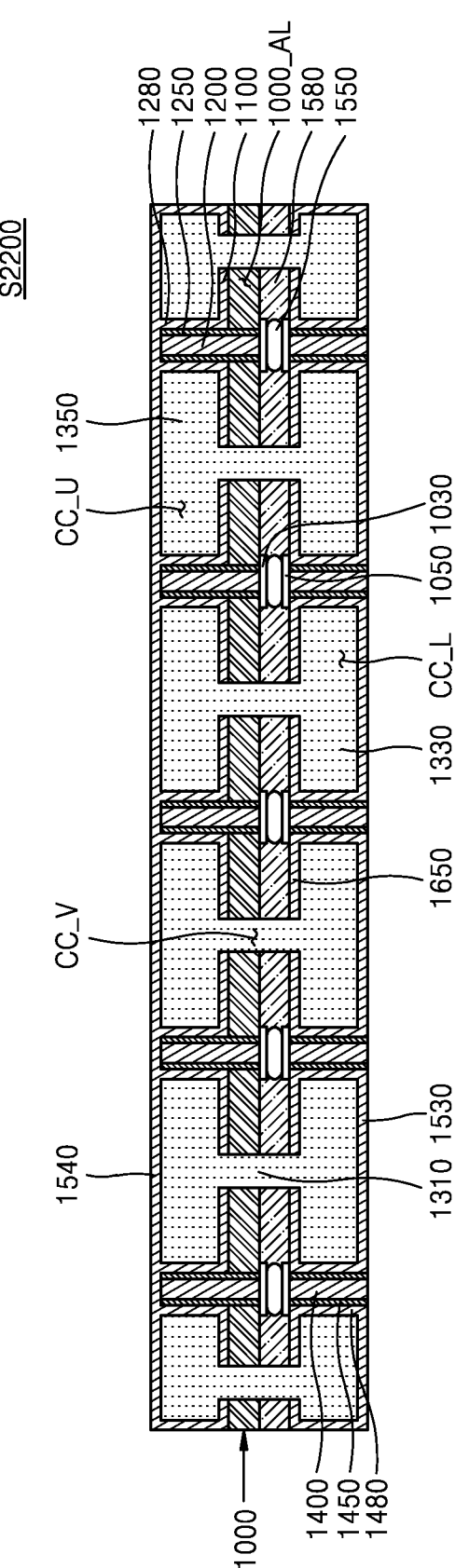

Referring to FIG. 19, the method of manufacturing a semiconductor package, according to an example embodiment of the inventive concept, may include operation S2200 of forming the upper cooling plate 1540 on the second horizontal porous structure 1350.

In an example embodiment, a material of the upper cooling plate 1540 provided in operation S2200 may include Si. For example, the upper cooling plate 1540 may be a wafer.

In an example embodiment, in operation S2200, the upper cooling plate 1540 may cover an upper surface of the second horizontal porous structure 1350 and an upper surface of the second through electrode 1200.

Figure 20:
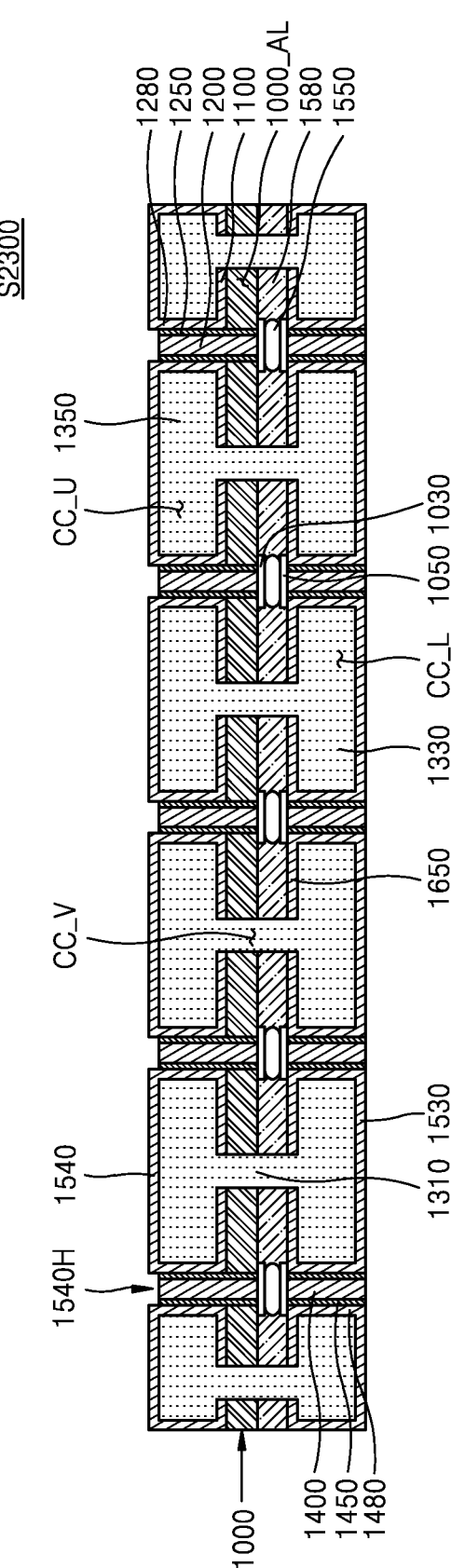

Referring to FIG. 20, the method of manufacturing a semiconductor package, according to an example embodiment of the inventive concept, may include operation S2300 of etching a portion of the upper cooling plate 1540 to expose a portion of the second through electrode 1200.

In operation S2300, by removing the portion of the upper cooling plate 1540 overlapping the second through electrode 1200 and the second passivation layer 1250 in the vertical direction, the upper cooling plate 1540 may have an etching hole 1540H. In addition, the upper surface of the second through electrode 1200 and an upper surface of the second passivation layer 1250 may be exposed through the etching hole 1540H.

Figure 21:
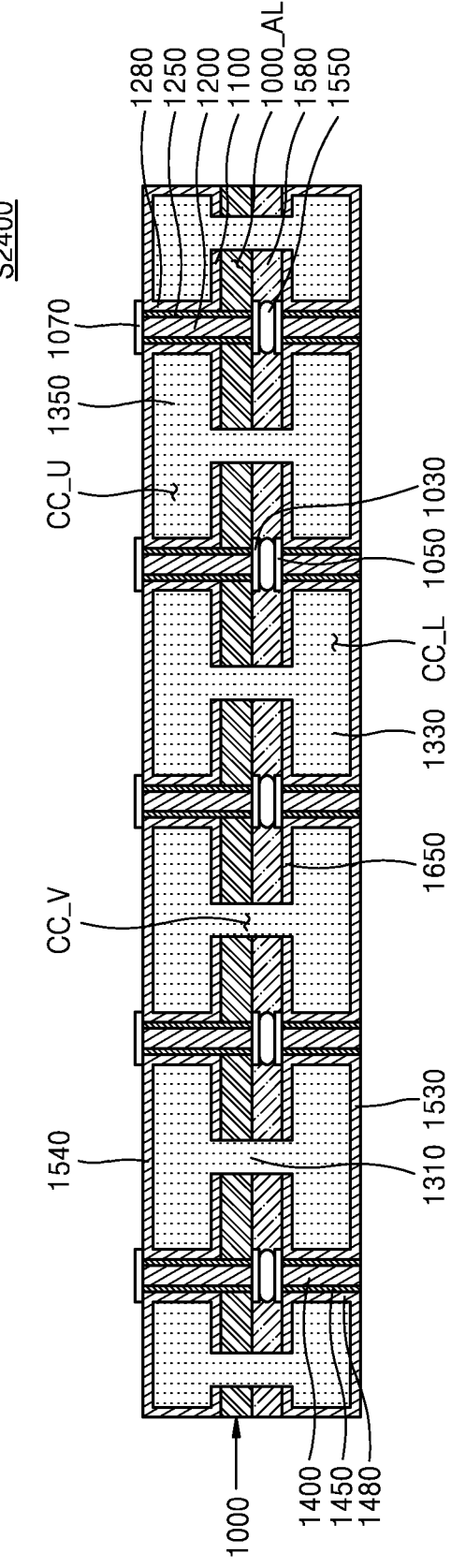

Referring to FIG. 21, the method of manufacturing a semiconductor package, according to an example embodiment of the inventive concept, may include operation S2400 of forming the second through electrode 1200 in the etching hole 1540H of the upper cooling plate 1540 and forming the upper conductive connection pad 1070 on the upper cooling plate 1540.

In an example embodiment, in operation S2400, the second passivation layer 1250 may cover inner surfaces of the upper cooling plate 1540, which define a plurality of etching holes 1540H. In addition, in operation S2400, the second through electrode 1200 may fill the plurality of etching holes 1540H by a plating process.

In addition, in an example embodiment, in operation S2400, the upper conductive connection pad 1070 may be formed on the upper cooling plate 1540 to be in contact with the second through electrode 1200. For example, the upper conductive connection pad 1070 may be formed by a photolithography process and a plating process.

The operations described with reference to FIGS. 8 to 21 may be performed to finish manufacturing of the semiconductor package 30 of FIG. 4 according to an example embodiment of the inventive concept.

While the inventive concept has been particularly shown and described with reference to example embodiments thereof, it will be understood that various changes in form and detail may be made therein without departing from the spirit and scope of the inventive concept, as defined by the following claims.

What is claimed is:

1. A semiconductor package, comprising:

a first semiconductor chip comprising a first semiconductor substrate having a first active layer, a first chip through electrode connected to the first active layer by passing through the first semiconductor substrate in a vertical direction, and a first upper chip pad disposed on the first semiconductor substrate and connected to the first chip through electrode;

a second semiconductor chip disposed on the first semiconductor chip, the second semiconductor chip comprising a second semiconductor substrate having a second active layer, and a second lower chip pad disposed below the second semiconductor substrate and connected to the second active layer;

a chip connection terminal disposed between the first upper chip pad and the second lower chip pad;

a first underfill layer disposed between the first semiconductor chip and the second semiconductor chip and surrounding the chip connection terminal;

a vertical porous structure entirely filling spaces of a plurality of vertical cooling channels passing through the first semiconductor chip, the second semiconductor chip, and the first underfill layer in the vertical direction, and having a plurality of first cooling holes;

a cooling fluid provided to the plurality of first cooling holes of the vertical porous structure;

a lower porous structure covering a lower surface of the first semiconductor chip, the lower porous structure forming a lower cooling channel connected to the vertical cooling channels and comprises a plurality of second cooling holes;

a lower cooling plate disposed on a bottom surface of the lower porous structure;

a lower through electrode passing through the lower porous structure and the lower cooling plate in the vertical direction, having a lower surface at a same level with a lower surface of the lower cooling plate, and horizontally spaced apart from the lower porous structure and the lower cooling plate; and a lower passivation layer disposed between a sidewall of the lower through electrode and a sidewall of the lower porous structure, and extending between the sidewall of the lower through electrode and a sidewall of the lower cooling plate, wherein the cooling fluid flows inside the plurality of vertical cooling channels, wherein the first semiconductor chip further comprises:

a first lower chip pad disposed below the first semiconductor substrate and connected to the first active layer; and a lower connection terminal attached to the first lower chip pad, and wherein the lower connection terminal is disposed between the lower through electrode and the first lower chip pad.

2. The semiconductor package of claim 1, further comprising:

an upper porous structure covering an upper surface of the second semiconductor chip, wherein the upper porous structure forms an upper cooling channel connected to the vertical cooling channels, and comprises a plurality of third cooling holes, wherein the cooling fluid flows inside the vertical cooling channels, the lower cooling channel, and the upper cooling channel through the first cooling holes, the second cooling holes, and the third cooling holes.

3. The semiconductor package of claim 2, wherein the semiconductor package further comprises:

a lower underfill layer disposed between the first semiconductor chip and the lower porous structure and surrounding the lower connection terminal;

a lower support layer disposed between the lower underfill layer and the lower porous structure;

an upper support layer disposed between the second semiconductor chip and the upper porous structure; and a lower connection pad disposed on the lower support layer and in contact with the lower connection terminal.

4. The semiconductor package of claim 3, further comprising:

an upper cooling plate disposed on the upper porous structure.

5. The semiconductor package of claim 4, further comprising:

a package connection pad disposed below the lower cooling plate and connected to the lower through electrode; and a package connection terminal attached to the package connection pad, wherein the lower through electrode further passes though the lower support layer.

6. The semiconductor package of claim 4, wherein a material of each of the upper cooling plate and the lower cooling plate includes at least any one of silicon and copper.

7. The semiconductor package of claim 1, wherein a material of the vertical porous structure includes copper.

8. The semiconductor package of claim 1, wherein a material of the cooling fluid includes at least any one of distilled water and a fluorine compound.

9. A semiconductor package, comprising:

a first semiconductor chip comprising a first semiconductor substrate having a first active layer, and a first chip pad disposed below the first semiconductor substrate and connected to the first active layer;

a first support layer disposed below the first semiconductor chip;

a first lower conductive connection pad disposed on the first support layer;

a first chip connection terminal disposed between the first chip pad and the first lower conductive connection pad;

a first underfill layer disposed between the first semiconductor chip and the first support layer and surrounding the first chip connection terminal;

a vertical porous structure entirely filling spaces of a plurality of vertical cooling channels passing through the first semiconductor chip, the first underfill layer, and the first support layer in a vertical direction, and having a plurality of first cooling holes;

a first horizontal porous structure disposed below the first support layer, wherein the first horizontal porous structure forming a first horizontal cooling channel connected to the plurality of vertical cooling channels, and comprises a plurality of second cooling holes;

a lower cooling plate disposed on a bottom surface of the first horizontal porous structure and extending along a sidewall of the first horizontal porous structure;

a second horizontal porous structure disposed on the first semiconductor chip and forming a second horizontal cooling channel connected to the plurality of vertical cooling channels, wherein the second horizontal porous structure comprising a plurality of third cooling holes;

an upper cooling plate disposed on the uppermost porous structure;

a first through electrode passing through the lower cooling plate, the first horizontal porous structure and the first support layer in the vertical direction, and connected to the first lower conductive connection pad;

a package connection pad disposed on a lower surface of the first through electrode and on a lower surface of the lower cooling plate;

a first passivation layer between a sidewall of the first horizontal porous structure and a sidewall of the first through electrode;

a second through electrode passing through at least a portion of the second horizontal porous structure and the first semiconductor substrate in the vertical direction, and connected to the first chip pad;

a second passivation layer between a sidewall of the second horizontal porous structure and a sidewall of the second through electrode; and a cooling fluid flowing inside the plurality of vertical cooling channels, the first horizontal cooling channel, and the second horizontal cooling channel through the first cooling holes, the second cooling holes, and the third cooling holes.

10. The semiconductor package of claim 9, further comprising:

a second semiconductor chip disposed on the first semiconductor chip, the second semiconductor chip comprising a second semiconductor substrate having a second active layer, and a second chip pad disposed below the second semiconductor substrate and connected to the second active layer;

a second support layer disposed under the second semiconductor chip;

a second lower conductive connection pad disposed on the second support layer;

a second chip connection terminal disposed between the second chip pad and the second lower conductive connection pad;

a second underfill layer disposed between the second semiconductor chip and the second support layer and surrounding the second chip connection terminal; and an uppermost porous structure disposed above the second semiconductor chip and having a plurality of fourth cooling holes forming an uppermost cooling channel, wherein the plurality of vertical cooling channels of the vertical porous structure are connected to the first horizontal cooling channel, the second horizontal cooling channel, and the uppermost cooling channel by passing through the second semiconductor chip, the second underfill layer, and the second support layer in the vertical direction.

11. The semiconductor package of claim 10, further comprising:

a package connection terminal attached to the package connection pad, wherein the package connection pad is connected to the lower through electrode.

12. The semiconductor package of claim 10, wherein a material of each of the upper cooling plate and the lower cooling plate includes at least any one of silicon and copper.

13. The semiconductor package of claim 9, wherein a material of each of the vertical porous structure, the first horizontal porous structure, and the second horizontal porous structure includes copper.

14. The semiconductor package of claim 9, wherein a material of the cooling fluid includes at least any one of distilled water and a fluorine compound.

15. The semiconductor package of claim 9, wherein a width of each of the plurality of vertical cooling channels in a horizontal direction is about 0.5 micrometers to about 100 micrometers.

16. A semiconductor package, comprising:
a first semiconductor chip having a first active layer;
a first chip connection terminal disposed under the first semiconductor chip and electrically connected to the first active layer;
a second semiconductor chip disposed on the first semiconductor chip and having a second active layer;
a third semiconductor chip disposed on the second semiconductor chip and having a third active layer;
a lowermost porous structure disposed below the first semiconductor chip and having a plurality of first cooling holes forming a lowermost cooling channel;
a lower cooling plate disposed directly below the lowermost porous structure;
a lower through electrode passing through the lowermost porous structure and the lower cooling plate in a vertical direction, having a lower surface at a same level with a lower surface of the lower cooling plate, and horizontally spaced apart from the lowermost porous structure and the lower cooling plate, the lower through electrode electrically connected to the first chip connection terminal;
a lower passivation layer disposed between a sidewall of the lower through electrode and a sidewall of the lowermost porous structure, and extending between the sidewall of the lower through electrode and a sidewall of the lower cooling plate;
a first horizontal porous structure disposed between the first semiconductor chip and the second semiconductor chip and having a plurality of second cooling holes forming a first horizontal cooling channel;
a second horizontal porous structure disposed between the second semiconductor chip and the third semiconductor chip and having a plurality of third cooling holes forming a second horizontal cooling channel;
an uppermost porous structure disposed on the third semiconductor chip and having a plurality of fourth cooling holes forming an uppermost cooling channel;

a vertical porous structure having a plurality of fifth cooling holes forming a plurality of vertical cooling channels connecting the lowermost cooling channel, the first horizontal cooling channel, and the uppermost cooling channel by passing through the first semiconductor chip, the second semiconductor chip, and the third semiconductor chip in a vertical direction,
wherein the vertical porous structure entirely fills spaces of the plurality of vertical cooling channels; and
a cooling fluid flowing inside the lowermost cooling channel, the first horizontal cooling channel, the second horizontal cooling channel, and the plurality of vertical cooling channels.

17. The semiconductor package of claim 16, further comprising:
a first underfill layer disposed between the first semiconductor chip and the lowermost porous structure and surrounding the first chip connection terminal;
a second chip connection terminal disposed under the second semiconductor chip and connected to the second active layer;
a second underfill layer disposed between the second semiconductor chip and the first horizontal porous structure and surrounding the second chip connection terminal;
a third chip connection terminal disposed under the third semiconductor chip and connected to the third active layer;
a third underfill layer disposed between the third semiconductor chip and the second horizontal porous structure and surrounding the third chip connection terminal;
a first through electrode configured to electrically connect the first chip connection terminal to the second chip connection terminal by passing through the first semiconductor chip and the first horizontal porous structure in the vertical direction; and
a second through electrode configured to electrically connect the second chip connection terminal to the third chip connection terminal by passing through the second semiconductor chip and the second horizontal porous structure in the vertical direction.

18. The semiconductor package of claim 17, further comprising:
an upper cooling plate disposed on the uppermost porous structure.

19. The semiconductor package of claim 18, wherein a material of each of the upper cooling plate and the lower cooling plate includes at least any one of silicon and copper.

* * * * *